(12) United States Patent
Kato

(10) Patent No.: US 8,287,159 B2
(45) Date of Patent: Oct. 16, 2012

(54) REFLECTOR, DISPLAY DEVICE, AND METHOD OF MANUFACTURING THE SAME

(75) Inventor: Eisaku Kato, Toyko (JP)

(73) Assignee: Sony Corporation, Tokyo (JP)

( * ) Notice: Subject to any disclaimer, the term of this patent is extended or adjusted under 35 U.S.C. 154(b) by 268 days.

(21) Appl. No.: 12/621,773

(22) Filed: Nov. 19, 2009

(65) Prior Publication Data

US 2010/0124044 A1    May 20, 2010

(30) Foreign Application Priority Data

Nov. 20, 2008    (JP) .............................. P2008-297051

(51) Int. Cl.
*F21V 7/00*    (2006.01)
(52) U.S. Cl. .. 362/341; 362/97.1; 362/247; 362/296.01; 362/346
(58) Field of Classification Search ................. 362/97.1, 362/247, 253, 296.01, 327, 341, 346; 313/504–506
See application file for complete search history.

(56) References Cited

U.S. PATENT DOCUMENTS

| | | | |
|---|---|---|---|
| 3,351,753 A * | 11/1967 | Berger | 362/327 |
| 2007/0063645 A1 * | 3/2007 | Yokoyama | 313/506 |

FOREIGN PATENT DOCUMENTS

| | | |
|---|---|---|
| JP | 2001-85738 | 3/2001 |
| JP | 2002-299044 | 10/2002 |
| JP | 2003-24981 | 9/2003 |
| JP | 2004-521475 | 7/2004 |
| JP | 2004-259606 | 9/2004 |
| JP | 2005-322623 | 8/2005 |
| JP | 2005-227519 | 11/2005 |
| JP | 2001-31355 | 2/2006 |
| JP | 2007-157404 | 6/2007 |

OTHER PUBLICATIONS

Japanese Office Action issued May 15, 2012, for corresponding Japanese Appln. No. 2008-297051.

* cited by examiner

*Primary Examiner* — Stephen F Husar
*Assistant Examiner* — Meghan Dunwiddie
(74) *Attorney, Agent, or Firm* — K&L Gates LLP

(57) ABSTRACT

A reflector capable of suppressing contrast reduction caused by retro-reflection of outside light, a display device having the same, and a method of manufacturing the same are provided. The reflector includes: a base having first and second opposed surfaces, the second surface being provided with a reflective element; and a light absorbing film formed in a region other than the reflective element in the second surface.

3 Claims, 30 Drawing Sheets

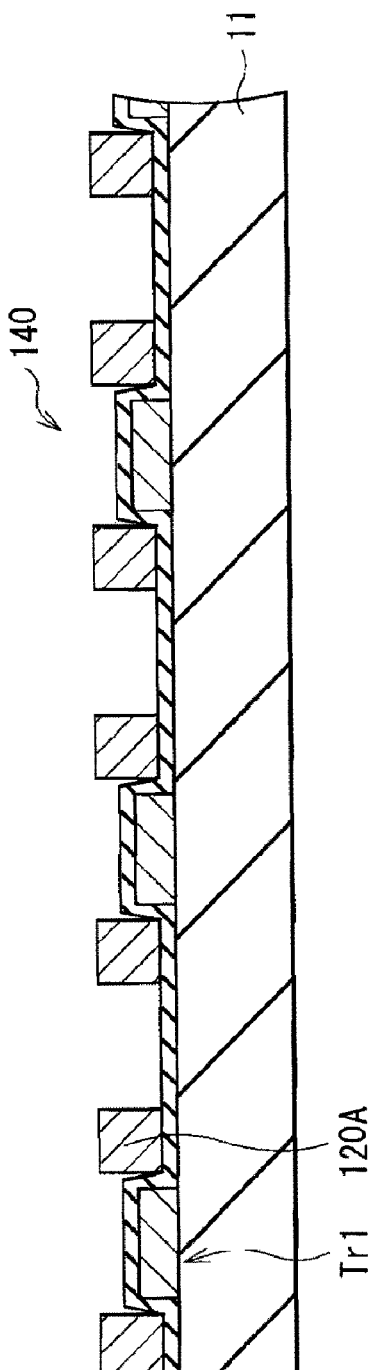
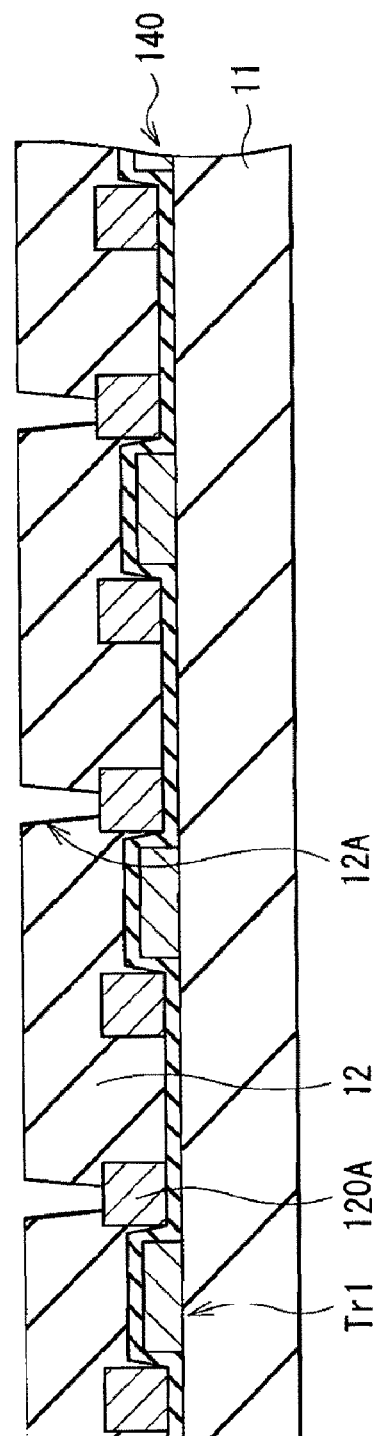

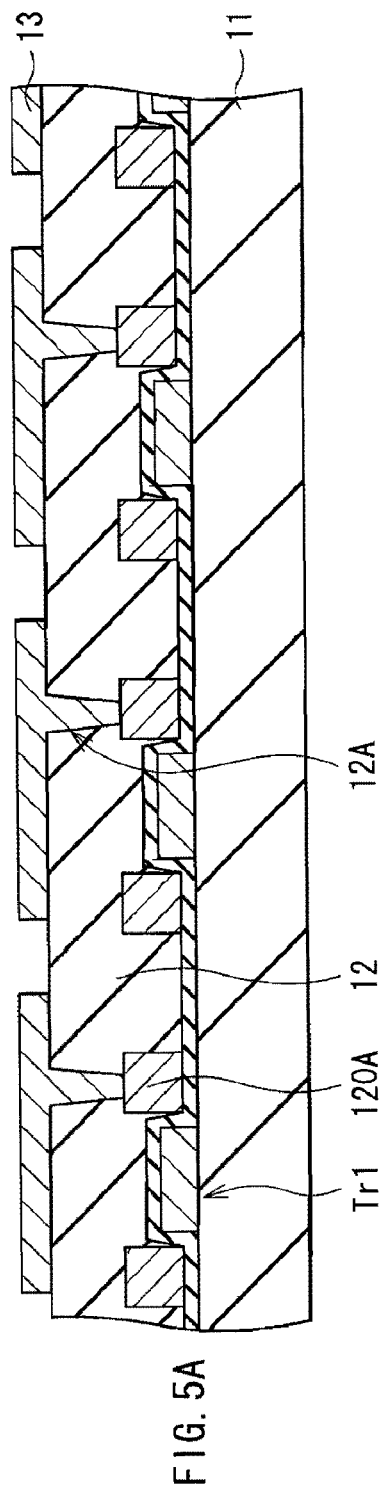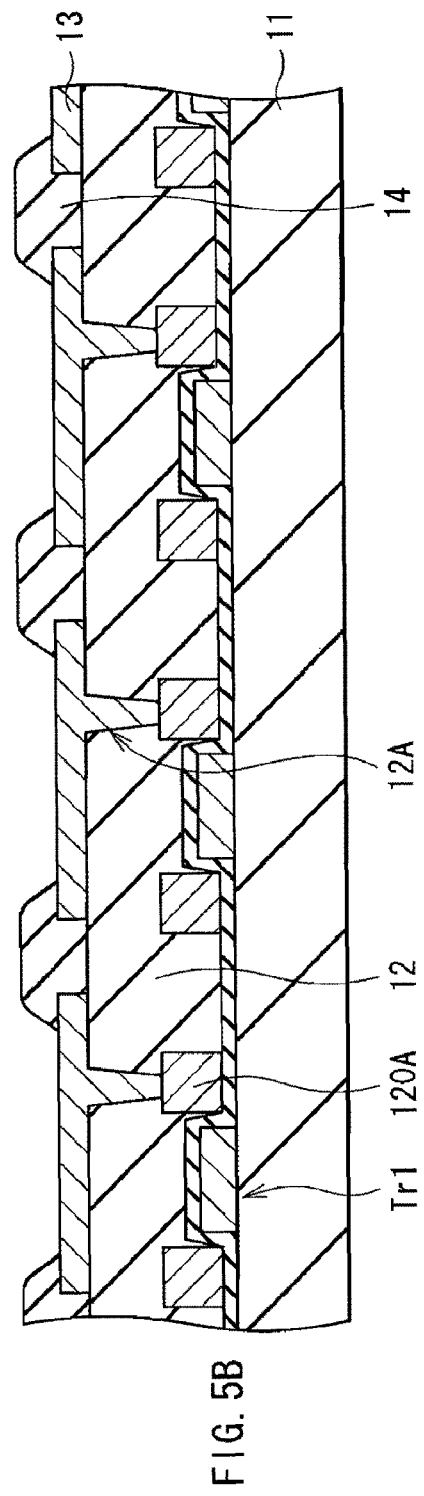

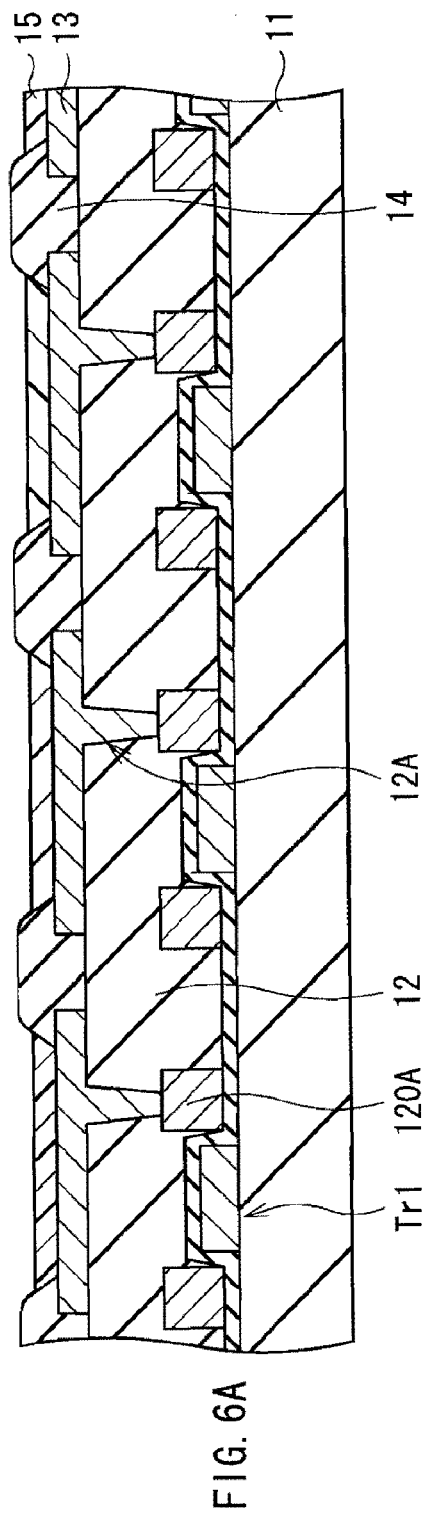
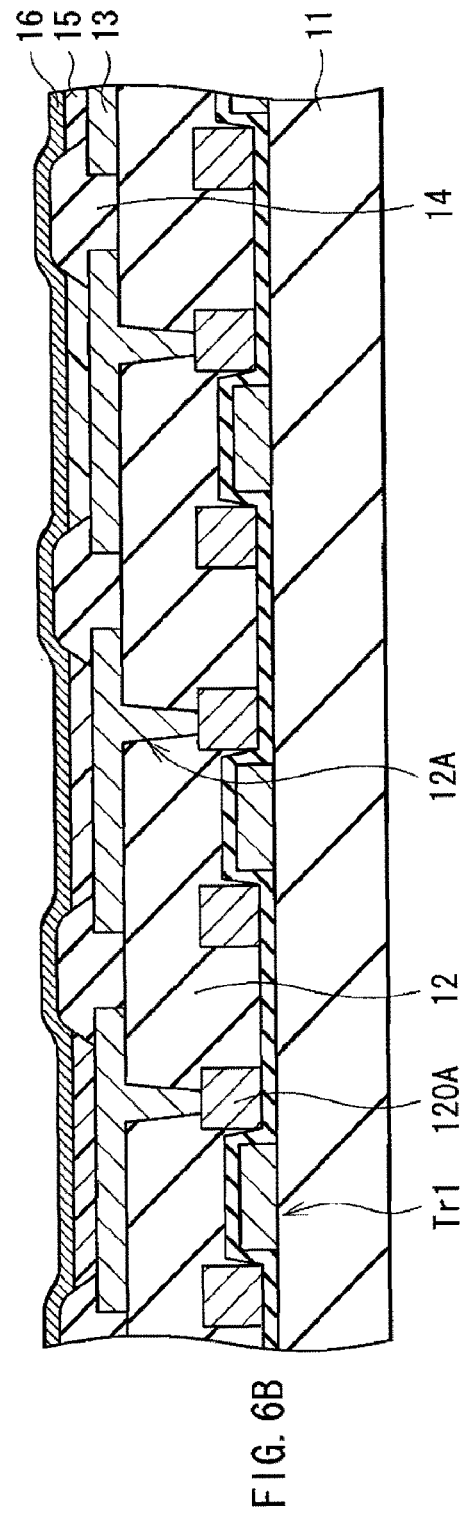
FIG. 6A
FIG. 6B

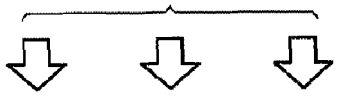

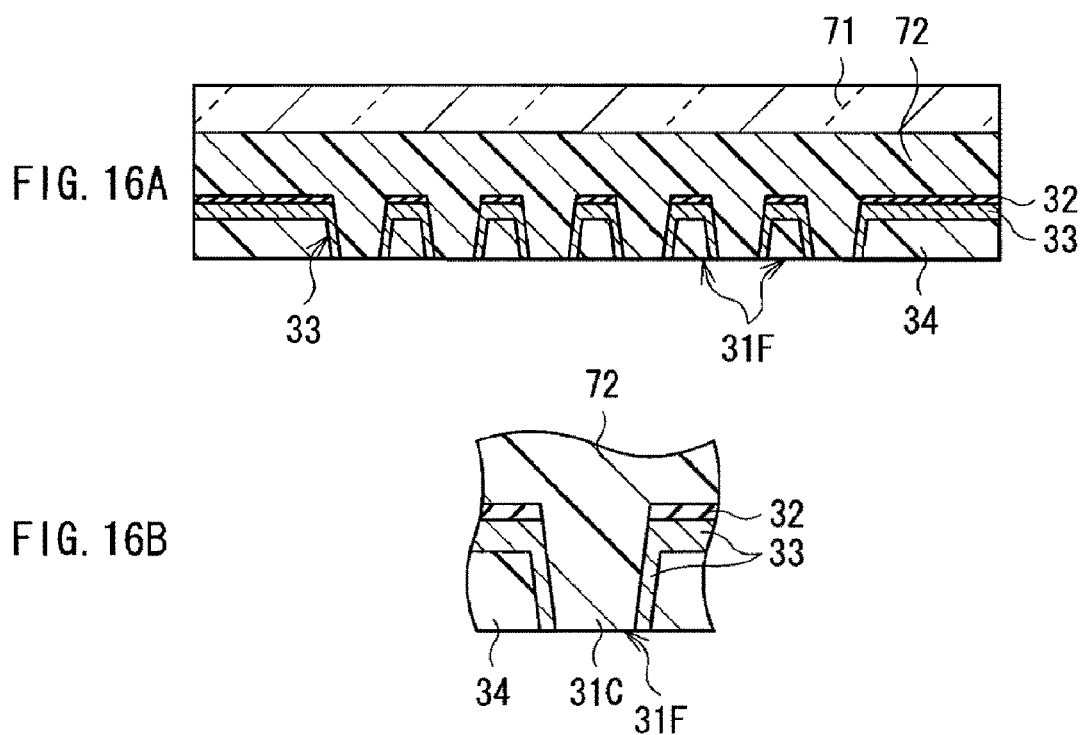

FIG. 19A
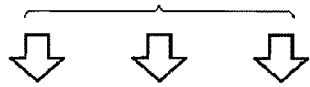
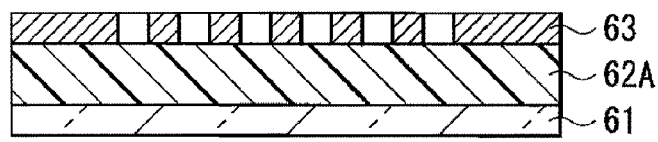
FIG. 19B

REFLECTOR, DISPLAY DEVICE, AND METHOD OF MANUFACTURING THE SAME

CROSS REFERENCES TO RELATED APPLICATIONS

The present application claims priority to Japanese Priority Patent Application JP 2008-297051 filed in the Japanese Patent Office on Nov. 20, 2008, the entire content of which is hereby incorporated by reference.

BACKGROUND

The present application relates to a reflector for improving luminance of a display device using a self-luminous light emitting element such as an organic EL (Electroluminescence) element, a display device having the same, and a method of manufacturing the same.

A self-luminous light emitting element such as an organic light emitting element has a first electrode, layers including a light emitting layer, and a second electrode in order on a substrate. When DC voltage is applied across the first and second electrodes, hole-electron recombination occurs in the light emitting layer, and light is generated. In some cases, the generated light is extracted from the first electrode side and the substrate. There is also a case that the generated light is extracted from the second electrode side, that is, the side opposite to circuits including a TFT (Thin Film Transistor) and wirings in order to increase the aperture ratio. In the case of extracting light from the second electrode side, generally, a metal electrode having high reflectance is used as the first electrode.

An example of a display device using a self-luminous light emitting element is a display device using an organic light emitting element as described in, for example, Japanese Unexamined Patent Application Publication No. 2005-227519. A display device of related art is provided with a light shield film as a so-called black matrix as a measure to increase contrast. The light shield film is provided to absorb outside light, decrease luminance of black level on the screen, and increase visibility, and is formed together with a color filter over a sealing substrate. In the case of a display device using an organic light emitting element, the color filter is used to regulate light emission wavelength and realize excellent color reproducibility.

In a display device using an organic light emitting element, it is also proposed to dispose a reflector near the organic light emitting element in order to increase display luminance to improve the efficiency of extracting light from the organic light emitting element as described in, for example, Japanese Unexamined Patent Application Publication No. 2001-85738.

However, the technique in related art relates to only the reflector. Examination on the structure including the function of a black matrix and a method of manufacturing the reflector has not been made, and there is room for improvement.

Further, in reality, the light shield film transmits light at the order of a few percents. Consequently, so-called retro-reflection such that outside light passed through the light shield film is reflected by a reflector film formed on the reflector and is returned to the observer side occurs. It causes a stray ray which induces contrast reduction.

SUMMARY

It is therefore desirable to provide a reflector capable of suppressing contrast reduction caused by retro-reflection of outside light, a display device having the same, and a method of manufacturing the same.

According to an embodiment, there is provided a reflector including: a base having first and second opposed surfaces, the second surface being provided with a reflective element; and a light absorbing film formed in a region other than the reflective element in the second surface.

According to an embodiment, there is provided a display device including: a light emission panel having a plurality of self-luminous light emitting elements on a substrate; and a reflector provided on a light extraction side of the light emission panel. The reflector is constructed by the above-described reflector of an embodiment.

According to an embodiment, there is provided a first method of manufacturing a display device including the steps of: forming a light emission panel by forming self-luminous light emitting elements on a substrate; forming a reflector having a reflective element; and disposing the reflector on a light extraction side of the light emission panel so that a front end face of the reflective element faces the self-luminous light emitting element. The step of forming the reflector includes the following steps (A) to (E):

(A) forming a base having first and second opposed surfaces, the second surface being provided with the reflective element;

(B) forming a light absorbing material film on the second surface of the base;

(C) removing the light absorbing material film on side faces of the reflective element by isotropic etching;

(D) after removal of the light absorbing material film on the side faces of the reflective element, forming a reflective material film on the second surface of the base; and (E) removing the reflective material film and the light absorbing material film on the front end face of the reflective element, thereby forming a light absorbing film in a region other than the reflective element in the second surface, and forming a reflector film on side faces of the reflective element and on the light absorbing film.

According to an embodiment, there is provided a second method of manufacturing a display device including the steps of: forming a light emission panel by forming self-luminous light emitting elements on a substrate; forming a reflector having a reflective element; and disposing the reflector on a light extraction side of the light emission panel so that a front end face of the reflective element faces the light emitting element. The step of forming the reflector includes the following steps (A) to (E):

(A) forming a base having first and second opposed surfaces, the second surface being provided with the reflective element;

(B) forming a reflecting material film on the second surface of the base;

(C) removing the reflecting material film in a region other than the reflective element in the second surface and on the front end face of the reflective element by anisotropic etching;

(D) after removal of the reflecting material film in the region other than the reflective element in the second surface and on the front end face of the reflective element, forming a light absorbing material film on the second surface of the base; and (E) removing the reflecting material film and the light absorbing material film on the front end face of the reflective element, thereby forming a reflector film on side faces of the reflective element and forming a light absorbing film on a region other than the reflective element in the second surface and on the reflector film.

In the reflector and the display device of an embodiment, light generated by a self-luminous light emitting element on the light emission panel enters from the front end face of the reflective element, is reflected by side faces of the reflective element, and extracted to the outside. Since the light absorbing film is formed in the region other than the reflective element in the second surface, the outside light is absorbed by the light absorbing film. Therefore, in the case of forming the reflector film on the side faces of the reflective element, retro-reflection of the outside light by the reflector film is suppressed, stray light is reduced, and contrast reduction is suppressed.

In the reflector and the display device of an embodiment, the light absorbing film is formed in the region other than the reflective element in the second surface of the base. Therefore, outside light is absorbed by the light absorbing film, and contrast reduction caused by retro-reflection of the outside light may be suppressed.

In the first method of manufacturing a display device of the embodiment of the invention, in the step of forming the reflector, the light absorbing material film is formed on the second surface of the base, and the light absorbing material film on side faces of the reflective element is removed by isotropic etching. After that, the reflecting material film is formed on the second surface of the base. In the second method of manufacturing a display device of the embodiment of the invention, the reflecting material film is formed on the second surface of the base, and the reflecting material film in the region other than the reflective element in the second surface and on the front end face of the reflective element is removed by anisotropic etching. After that, the light absorbing material film is formed on the second surface of the base. Therefore, the display device of the embodiment of the present invention may be manufactured with simple processes.

Additional features and advantages are described herein, and will be apparent from the following Detailed Description and the figures.

BRIEF DESCRIPTION OF THE FIGURES

FIGS. 4A and 4B are cross sections illustrating a method of manufacturing the display device illustrated in FIG. 3 in process order.

FIGS. 5A and 5B are cross sections illustrating a process subsequent to FIGS. 4A and 4B.

FIGS. 6A and 6B are cross sections illustrating a process subsequent to FIGS. 5A and 5B.

FIGS. 16A and 16B are cross sections illustrating a process subsequent to FIGS. 15A and 15B.

FIGS. 19A to 19C are cross sections illustrating another method of manufacturing the display device illustrated in FIG. 3 in process order.

DETAILED DESCRIPTION

The present application will be described in detail hereinbelow with reference to the drawings according to an embodiment.

First Embodiment

Figure 1:
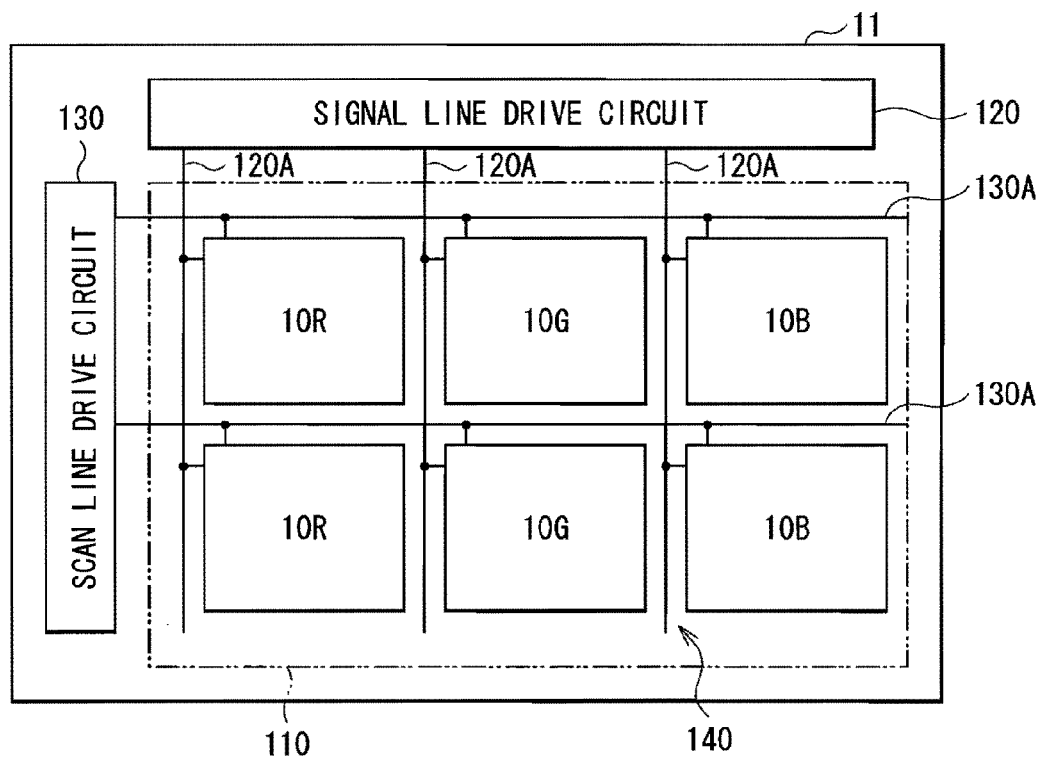
FIG. 1 is a diagram illustrating a configuration of a display device according to a first embodiment.

FIG. 1 illustrates a configuration of a display device according to a first embodiment. The display device is used as a very-thin organic light-emission color display device or the like. For example, over a drive substrate 11, a display region 110 in which a plurality of organic light emitting elements 10R, 10G, and 10B which will be described later are disposed in a matrix is formed. Around the display region 110, a signal line drive circuit 120 and a scan line drive circuit 130 as drivers for video image display are formed.

Figure 2:
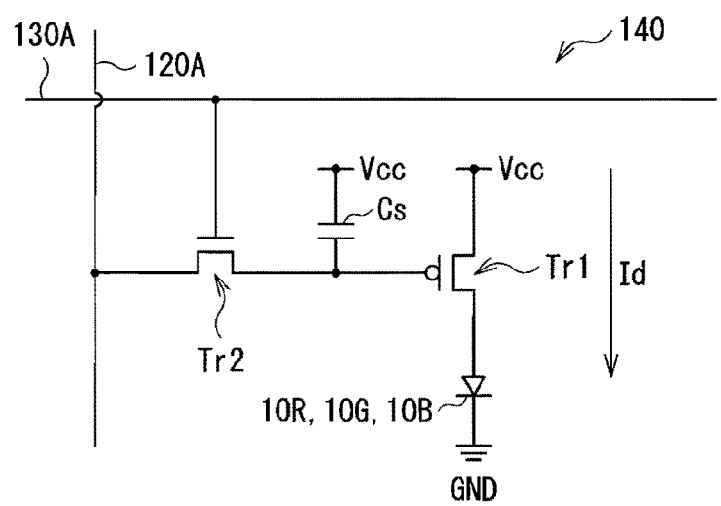
FIG. 2 is an equivalent circuit diagram illustrating an example of a pixel drive circuit illustrated in FIG. 1.

In the display region 110, a pixel drive circuit 140 is formed. FIG. 2 illustrates an example of the pixel drive circuit 140. The pixel drive circuit 140 is formed in a layer below a first electrode 13 which will be described later, and is an active-type drive circuit having a drive transistor Tr1 and a write transistor Tr2, a capacitor (retention capacitor) Cs between the transistors Tr1 and Tr2, and the organic light emitting element 10R (or 10G or 10B) connected to the drive transistor Tr1 in series between a first power supply line (Vcc) and a second power supply line (GND). The drive transistor Tr1 and the write transistor Tr2 are general thin film transistors (TFTs). The configuration of the transistors may be, for example, an inverted staggered structure (so-called bottom gate type) or a staggered structure (top gate type).

In the pixel drive circuit 140, a plurality of signal lines 120A are disposed in the column direction, and a plurality of scan lines 130A are disposed in the row direction. Each of cross points between the signal lines 120A and the scan lines 130A corresponds to any one (sub-pixel) of the organic light emitting elements 10R, 10G, and 10B. Each of the signal lines 120A is connected to the signal line drive circuit 120. From the signal line drive circuit 120, an image signal is supplied to the source electrode of the write transistor Tr2 via the signal line 120A. Each of the scan lines 130A is connected to the scan line drive circuit 130. From the scan line drive circuit 130, a scan signal is sequentially supplied to the gate electrode of the write transistor Tr2 via the scan line 130A.

Figure 3:
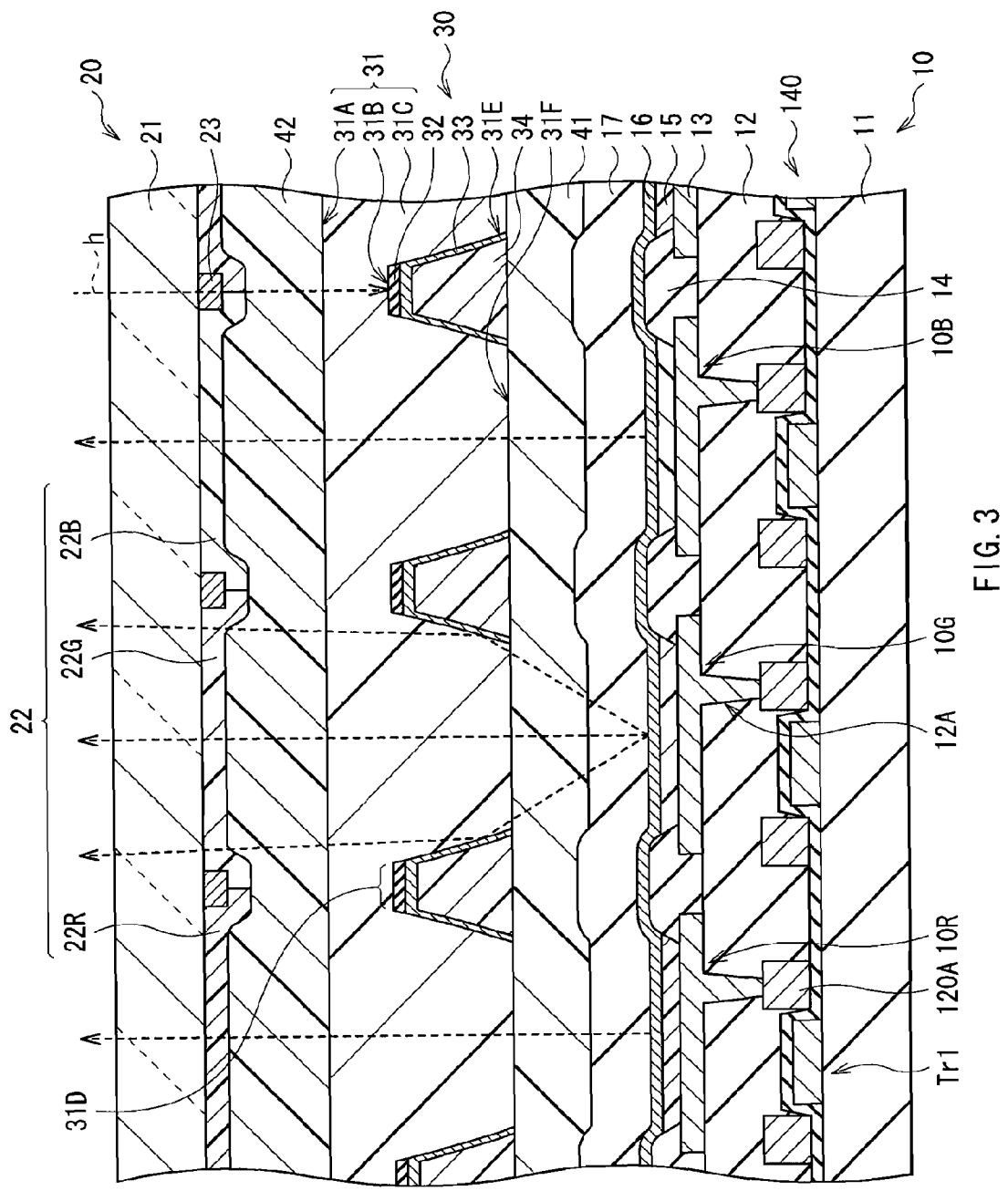
FIG. 3 is a cross section illustrating a configuration in a display region in the display device illustrated in FIG. 3.

FIG. 3 illustrates a sectional configuration in the display region 110 in the display device illustrated in FIG. 1. The display device has a reflector 30 between a light emission panel 10 and a sealing panel 20. The light emission panel 10 and the reflector 30 are adhered to each other with an adhesion layer 41 made of a thermoset resin, an ultraviolet curable resin, or the like in between. The reflector 30 and the sealing panel 20 are adhered to each other with an adhesion layer 42 made of a thermoset resin, an ultraviolet curable resin.

In the light emission panel 10, on the drive substrate 11 made of glass, silicon (Si) wafer, resin, or the like, the organic light emitting elements 10R for generating light of red, the organic light emitting elements 10G for generating light of green, and the organic light emitting elements 10B for generating light of blue are formed in order in a matrix as a whole. Each of the organic light emitting elements 10R, 10G, and 10B has a strip shape in plan view, and one pixel is constructed by a combination of the neighboring organic light emitting elements 10R, 10G, and 10B.

Each of the organic light emitting elements 10R, 10G, and 10B has a configuration in which, from the drive substrate 11 side, with the above-described pixel drive circuit 140 and a planarization layer 12 therebetween, the first electrode 13 as an anode, an insulting film 14, and an organic layer 15 including a light emission layer which will be described later, and a second electrode 16 as a cathode are stacked in this order, and are covered with a protection film 17 as necessary.

The first electrodes 13 are formed in correspondence with the organic light emitting elements 10R, 10G, and 10B and are electrically isolated from each other by the insulating film 14. The first electrode 13 has the function of a reflection electrode for reflecting light generated by a light emission layer. It is desirable to provide reflectance as high as possible from the viewpoint of increasing luminance efficiency. The first electrode 13 has, for example, a thickness of 100 nm to 1,000 nm both inclusive, and is made of aluminum (Al), an alloy containing aluminum (Al), silver (Ag), or an alloy containing silver (Ag). The first electrode 13 may be made of another metal element such as chromium (Cr), titanium (Ti), iron (Fe), cobalt (Co), nickel (Ni), molybdenum (Mo), copper (Cu), tantalum (Ta), tungsten (W), platinum (Pt), or gold (Au) or an alloy of the metal element.

The insulating film 14 is provided to assure insulation between the first electrode 13 and the second electrode 16 and to accurately form a light emission region to a desired shape and is made of, for example, an organic material such as photosensitive acrylic, polyimide, polybenzoxazole, or the like or an inorganic material such as silicon oxide ($SiO_2$). The insulating film 14 has openings in correspondence with light emission regions in the first electrodes 13. The organic layer 15 and the second electrode 16 may be continuously provided on not only the light emission regions but also the insulating film 14, but light is generated only in the openings in the insulating film 14.

The organic layer 15 has a configuration in which, for example, a hole injection layer, a hole transport layer, a light emission layer, and an electron transport layer are stacked in order on the first anode 13. The layers except for the light emission layer may be provided as necessary. The configuration of the organic layer 15 may vary according to light emission colors of the organic light emitting elements 10R, 10G, and 10B. The hole injection layer is a buffer layer for increasing the hole injection efficiency and for preventing leakage. The hole transport layer is provided to increase the efficiency of transporting holes to the light emission layer. When an electric field is applied, recombination of electrons and holes occurs, and the light emission layer generates light. The electron transport layer is provided to increase the efficiency of transporting electrons to the light emission layer. An electron injection layer (not illustrated) made of LiF, $Li_2O$, or the like may be provided between the electron transport layer and the second electrode 16.

The material of the hole injection layer of the organic hole layer 10R is, for example, 4,4',4"-tris(3-methylphenylamino) triphenylamine (m-MTDATA), or 4,4',4"-tris(2-naphthylphenylamino) triphenylamine (2-TNATA). The material of the hole transport layer of the organic light emitting element 10R is, for example, bis[(N-naphthyl)-N-phenyl]benzidine (α-NPD). The material of the light emission layer of the organic hole layer 10R is, for example, a material obtained by mixing 40 volume % by of 2,6-bis[4-[N-(4-methoxyphenyl)-N-phenyl]aminostyryl]naphthalene-1,5-dicarbonitrile (BSN-BCN) to 8-quinolinol aluminum complex ($Alq_3$). The material of the electron transport layer of the organic light emitting element 10R is, for example, $Alq_3$.

The material of the hole injection layer of the organic light emitting element 10G is, for example, m-MTDATA or 2-TNATA. The material of the hole transport layer of the organic light emitting element 10G is, for example, α-NPD. The material of the light emission layer of the organic light emitting element 10G is, for example, a material obtained by mixing 3 volume % of Coumarin6 to $Alq_3$. The material of the electron transport layer of the organic light emitting element 10G is, for example, $Alq_3$.

The material of the hole injection layer of the organic light emitting element 10B is, for example, m-MTDATA or 2-TNATA. The material of the hole transport layer of the organic light emitting element 10B is, for example, α-NPD. The material of the light emission layer of the organic light emitting element 10B is, for example, spiro 6Φ. The material of the electron transport layer of the organic light emitting element 10B is, for example, $Alq_3$.

The second electrode 16 has a thickness of, for example, 5 nm to 50 nm and is made of a metal element or an alloy of aluminum (Al), magnesium (Mg), calcium (Ca), sodium (Na) or the like. In particular, an alloy of magnesium and silver (MgAg alloy) or an alloy of aluminum (Al) and lithium (Li) (AlLi alloy) is preferable. The second electrode 16 may be made of ITO (indium tin oxide) or IZO (indium zinc composite oxide).

The protection film 17 has a thickness of, for example, 500 nm to 10,000 nm and is made of silicon oxide ($SiO_2$), silicon nitride (SiN), or the like.

The sealing panel 20 is positioned on the second electrode 16 side of the light emission panel 10 and has a sealing substrate 21 for sealing the organic light emitting elements 10R, 10G, and 10B together with an adhesion layer 42. The sealing substrate 21 is made of a material such as glass transparent to light generated by the organic light emitting elements 10R, 10G, and 10G. The sealing substrate 21 is provided with, for example, a color filter 22 and a light shield film 23 as a black matrix, extracts light generated by the organic light emitting elements 10R, 10G, and 10B, and absorbs external light reflected by the organic light emitting elements 10R, 10G, and 10B and the wirings between the organic light emitting elements 10R, 10G, and 10B, thereby improving contrast. Over the color filter 22 and the light shield film 23, an overcoat layer (not illustrated) made of an acrylic resin, an epoxy resin, or the like is provided to increase flatness.

The color filter 22 may be provided on any of the faces of the sealing substrate 21 but is preferably provided on the light emission panel 10 side. The reason is that the color filter 22 is not exposed to the surface and is protected by the adhesion layer 42. The color filter 22 has a red filter 22R, a green filter 22G, and a blue filter 22B which are disposed in order in correspondence with the organic light emitting elements 10R, 10G, and 10B.

The red filter 22R, the green filter 22G, and the blue filter 22B each having a rectangular shape are formed tightly. Each of the red filter 22R, the green filter 22G, and the blue filter 22B is made of a resin in which a pigment is mixed. By selecting the pigment, adjustment is made so that the light transmittance in the wavelength region of red, green, or blue as a target is high and the light transmittance in the other wavelength regions is low.

The light shield film 23 is provided along the boundary of the red filter 22R, the green filter 22G, and the blue filter 22B. The light shield film 23 is, for example, a resin film of black in which a colorant of black is mixed and having optical density of 1 or higher, or a thin film filter using interference of a thin film. It is preferable to construct the light shield film 23 by a resin film of black for a reason that the film may be easily formed at low cost. The thin film filter is obtained by, for example, stacking at least on thin film made of a metal, a metal nitride, or a metal oxide and attenuates light by using interference of the thin film. Concretely, the thin film filter is obtained by alternately stacking chromium and chromium oxide (III) ($Cr_2O_3$).

The reflector 30 is provided on the light extraction side of the light emission panel 10, that is, on the second electrode 16 side in order to increase the efficiency of extracting light from the organic light emitting elements 10R, 10G, and 10B. The reflector 30 includes a base 31 having a first surface 31A and a second surface 31B which face each other. The second surface 31B of the base 31 is provided with a plurality of projected reflection elements 31C. The base 31 may be made of ultraviolet curable resin or thermoset resin. Further, the base 31 may be obtained by forming a resin layer made of an ultraviolet curable resin or a thermoset resin on a glass substrate, and the reflection elements 31C are provided partly or entirely in the thickness direction of the resin layer.

A light absorption film 32 is formed in a planarized region 31D other than the reflection elements 31C in the second surface 31B of the base 31. The light absorption film 32 is provided to absorb outside light "h" which passed through the light shield film 23. The light absorption film 32 has, for example, a thickness of about 500 nm and is made of a material having high absorptance of light, such as a-Si or p-Si. With the configuration, in the display device, deterioration in contrast caused by retro-reflection of the outside light is suppressed.

A reflector film 33 is formed in a side face 31E of the reflective element 31C. The reflector film 33 is provided to make light incident from a front end face 31F of the reflective element 31C. For example, the reflector film 33 has a thickness of about 400 nm and is made of aluminum (Al) or an alloy containing aluminum (Al). The reflector film 33 may be provided not only on the side face 31E of the reflective element 31C but also on the light absorption film 32.

The periphery of the reflective element 31C is buried by a burying layer 34. The burying layer 34 is provided to prevent collapse or the like of the reflective element 31C at the time of polishing the front end of the reflective element 31C in a manufacturing process which will be described later and to increase the yield. The burying layer 34 is made of, for example, an acrylic or epoxy-based ultraviolet curable resin, thermoset resin, or the like. By providing the burying layer 34, the reflector 30 and the protection film 17 of the light emission panel 10 are adhered to each other in a state where they face each other. There is also an advantage such that stay of moisture and air component is suppressed more than the case where the reflector 30 and the protection film 17 are directly adhered with the adhesion layer 41 without providing the burying layer 34.

For example, the display device may be manufactured as follows.

FIGS. 4A and 4B to FIGS. 18A to 18C illustrate a method of manufacturing the display device in process order. First, as illustrated in FIG. 4A, on the drive substrate 11 made of the above-described material, the pixel drive circuit 140 is formed.

As illustrated in FIG. 4B, the planarization layer 12 made of, for example, photosensitive polyimide is applied on the entire surface of the drive substrate 11 by spin coating or the like and is patterned in a predetermined shape by exposing and developing process, and connection holes 12A are formed. After that, baking process is performed.

Subsequently, as illustrated in FIG. 5A, the first electrode 13 having the above-described thickness and made of the above-described material is formed on the planarization layer 12 by, for example, sputtering and is patterned in a predetermined shape by, for example, the lithography technique and etching. By the operation, the plurality of first electrodes 13 are formed on the planarization layer 12.

As illustrated in FIG. 5B, a photosensitive resin is applied on the entire surface of the drive substrate 11, openings are formed by the exposing and developing process, and baking operation is performed, thereby forming the insulating film 14.

As illustrated in FIG. 6A, for example, by the vacuum deposition method, the hole injection layer, the hole transport layer, the light emission layer, and the electron transport layer of the organic light emitting element 10R having the above-described thickness and made of the above-described material are sequentially formed, and the organic layer 15 of the organic light emitting layer 10R is formed. After that, as illustrated also in FIG. 6A, in a manner similar to the organic layer 15 of the organic light emitting element 10R, the hole injection layer, the hole transport layer, the light emission layer, and the electron transport layer of the organic light emitting element 10R having the above-described thickness and made of the above-described material are sequentially formed, thereby forming the organic layer 15 of the organic light emitting element 10G. Subsequently, as illustrated also in FIG. 6A, in a manner similar to the organic layer 15 of the organic light emitting element 10R, the hole injection layer, the hole transport layer, the light emission layer, and the electron transport layer having the above-described thickness and made of the above-described material are sequentially formed, thereby forming the organic layer 15 of the organic light emitting element 10B.

After forming the organic layer 15 of the organic light emitting elements 10R, 10G, and 10B, as illustrated in FIG. 6B, the second electrode 16 having the above-described thickness and made of the above-described material is formed on the entire surface of the drive substrate 11 by the evaporation method or the like. In such a manner, the organic light emitting elements 10R, 10G, and 10B illustrated in FIG. 3 are formed.

Figure 7:
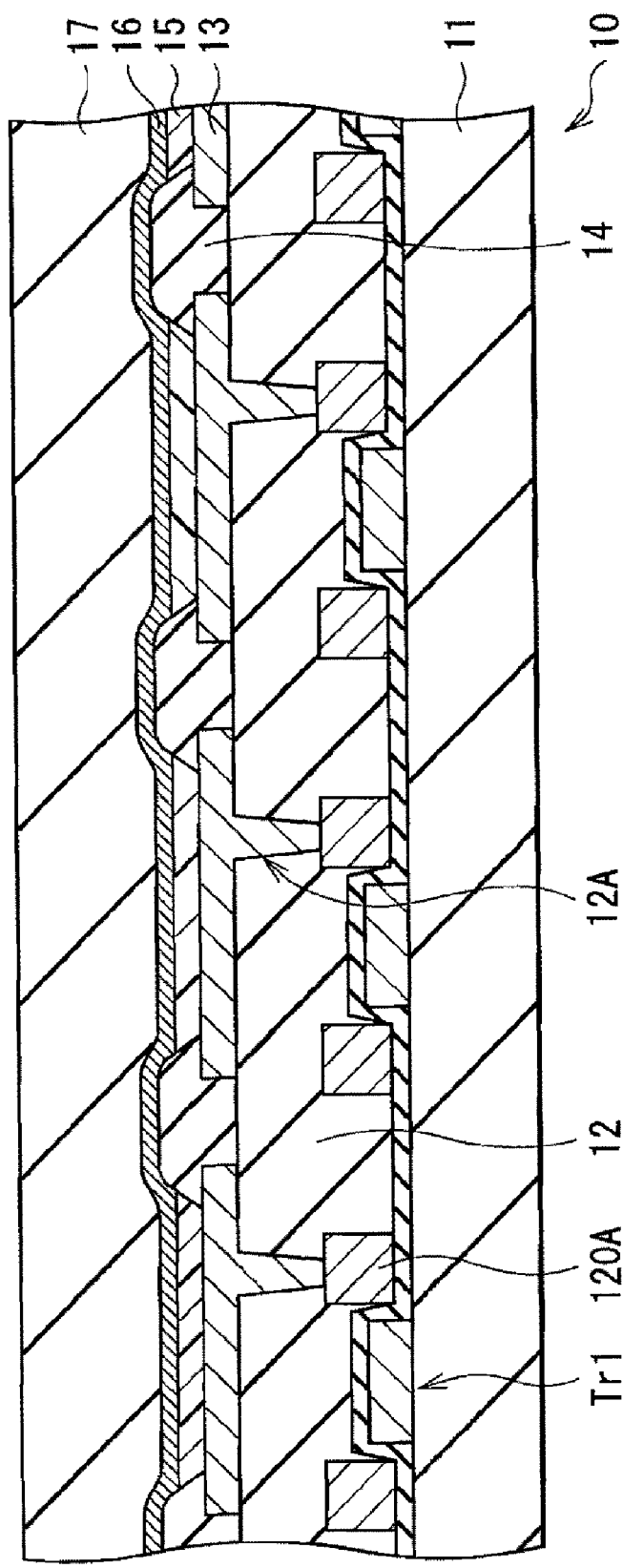
FIG. 7 is a cross section illustrating a process subsequent to FIGS. 6A and 6B.

Next, as illustrated in FIG. 7, the protection film 17 having the above-described thickness and made of the above-described material is formed on the second electrode 16. As a result, the light emission panel 10 illustrated in FIG. 3 is formed.

Figure 8A:
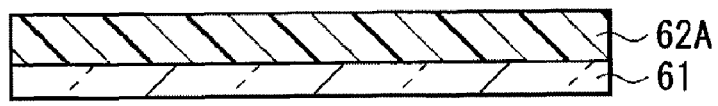
FIGS. 8A to 8C are cross sections illustrating a process subsequent to FIG. 7.
Figure 8B:
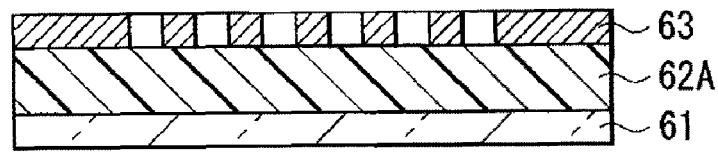
Figure 8C:

The reflector 30 is also formed. First, as illustrated in FIG. 8A, a resist is applied on a glass substrate 61 by using a slit coater or the like to form a resist film 62A. Subsequently, as illustrated in FIG. 8B, for example, by using the photolithography technique, the resist film 62A is exposed with ultraviolet light UV via a photomask 63 and developed to thereby pattern the resist film 62A. As illustrated in FIG. 8C, a mother die 64 in which projections 62 are formed on the glass substrate 61 is formed.

Figure 9A:
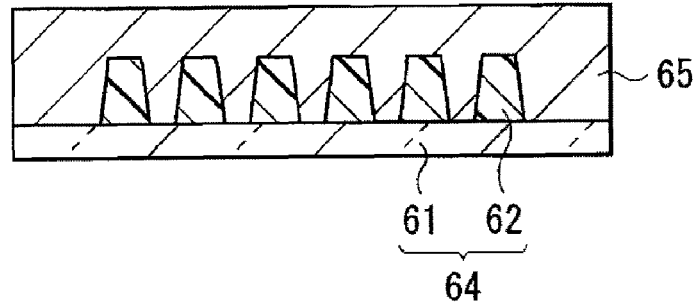
FIGS. 9A and 9B are cross sections illustrating a process subsequent to FIGS. 8A to 8C.
Figure 9B:
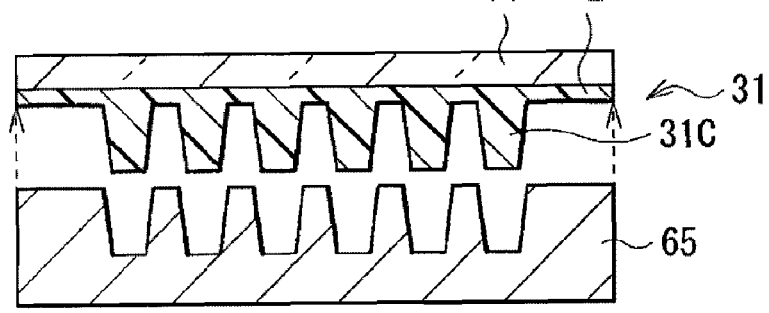

Subsequently, as illustrated in FIG. 9A, a mold 65 made of nickel (Ni) is formed by electrocasting using the mother die 64. As illustrated in FIG. 9B, by photo imprint (photo-polymerization (2P)) or thermal imprint using the mold 65, the base 31 is formed. In such a manner, a number of bases 31 are copied (replicated) from a single mold 65 at low cost. Productivity improves, and it is preferable for mass production.

Figure 10A:
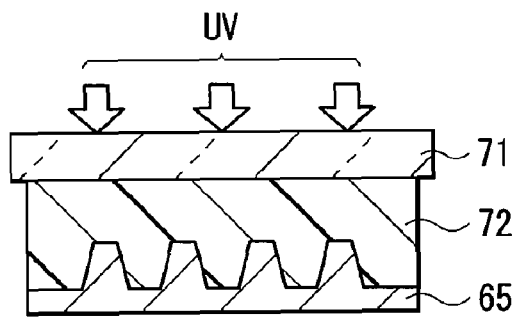
FIGS. 10A and 10B are cross sections illustrating an example of the process illustrated in FIG. 9B in process order.
Figure 10B:
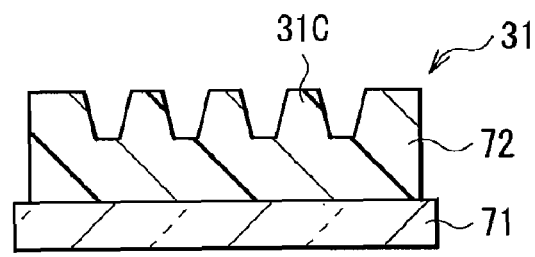

In the case of the photo imprint, first, as illustrated in FIG. 10A, a resin layer 72 made of an ultraviolet curable resin is formed on a glass substrate 71 made of, for example, BK-7 glass. The resin layer 72 is made come into contact with the mold 65, and ultraviolet rays are emitted. The irradiation condition is, for example, 300 mJ×30 pass (9 J). After that, the mold 65 is released, thereby forming the base 31 having the reflective elements 31C as illustrated in FIG. 10B.

Figure 11A:
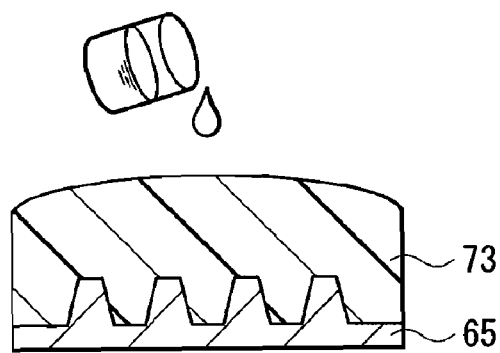
FIGS. 11A and 11B are cross sections illustrating another example of the process illustrated in FIG. 9B.
Figure 11B:
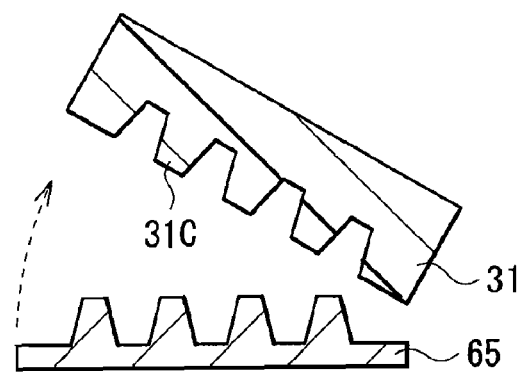

In the case of thermal imprint, first, as illustrated in FIG. 11A, a resin 73 such as PDMS (Poly-Dimethyl-Siloxane) is injected from a vessel 73A into the mold 65 and is thermally cured. As the PDMS, concretely, for example, "Sylgard (registered trademark) 184" manufactured by Dow Corning Corporation may be used. Curing conditions may be set to, for example, 58° C. and one hour. After that, as illustrated in FIG. 11B, by releasing the resultant from the mold 65, the base 31 having the reflective elements 31C is formed.

Figure 12A:
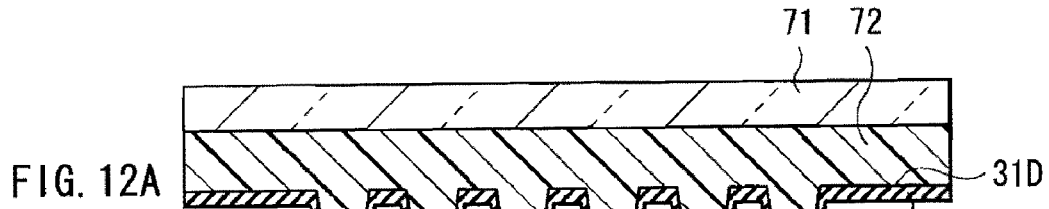
FIGS. 12A and 12B are cross sections illustrating a process subsequent to FIGS. 9A and 9B.
Figure 12B:
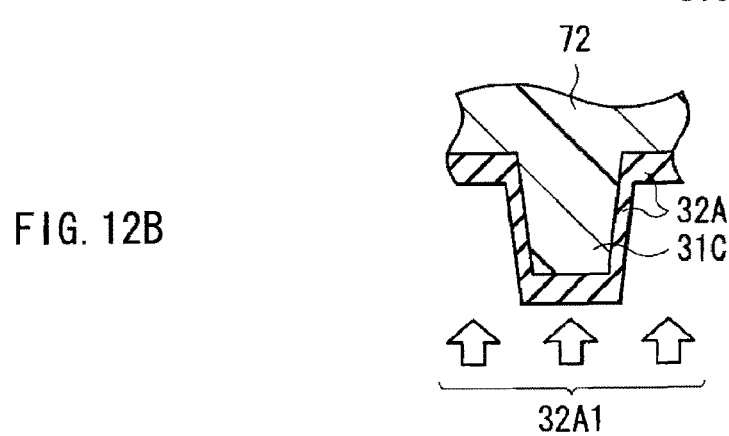

After formation of the base 31, as illustrated in FIG. 12A, a light absorption material film 32A made of a-Si, p-Si, or the like is formed on the surface of the base 31 by, for example, sputtering. At this time, as illustrated in FIG. 12B, a film forming material 32A1 is deposited in a direction almost perpendicular to the second surface 31B of the base 31. Consequently, the film forming rate in the side face 31E of the reflective element 31C and that in the planarized region 31D other than the reflective elements 31C in the second surface 31B of the base 31 and the front end face 31F of the reflective elements 31C are different from each other. The film forming rate in the side face 31E of the reflective element 31C is low.

Figure 13A:
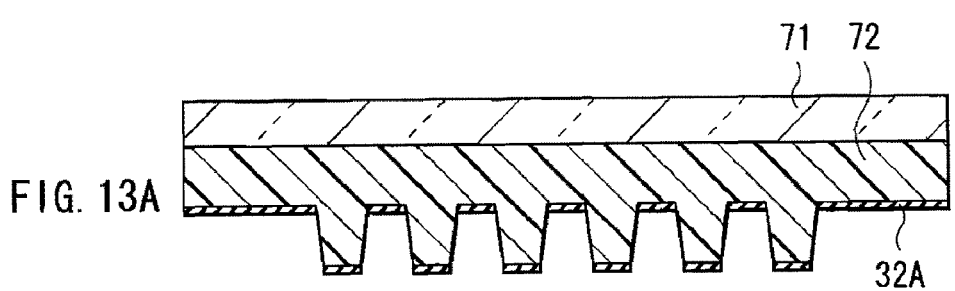
FIGS. 13A and 13B are cross sections illustrating a process subsequent to FIGS. 12A and 12B.
Figure 13B:
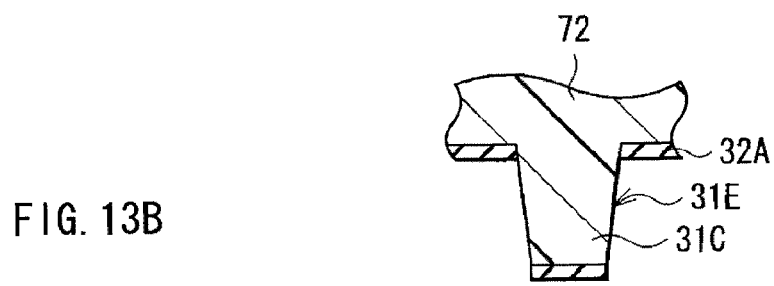

After forming the light absorption material film 32A, as illustrated in FIGS. 13A and 13B, the light absorption material film 32A on the side face 31E of the reflective element 31C is removed by, for example, isotropic etching using XeF2.

Figure 14A:
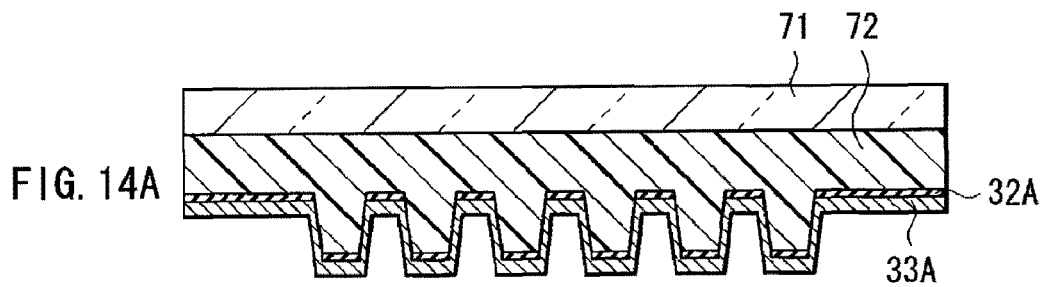
FIGS. 14A and 14B are cross sections illustrating a process subsequent to FIGS. 13A and 13B.
Figure 14B:
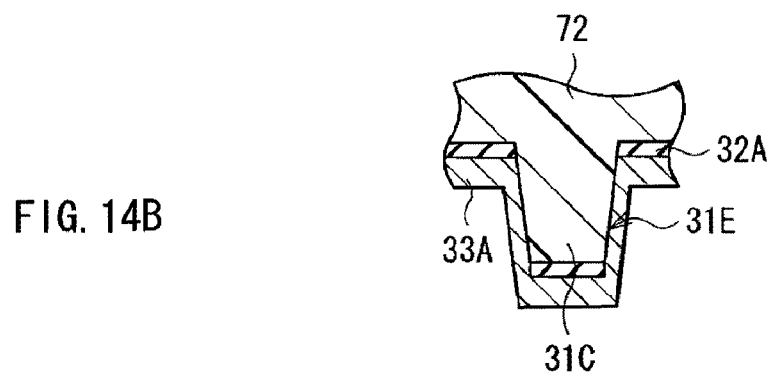
Figure 15A:
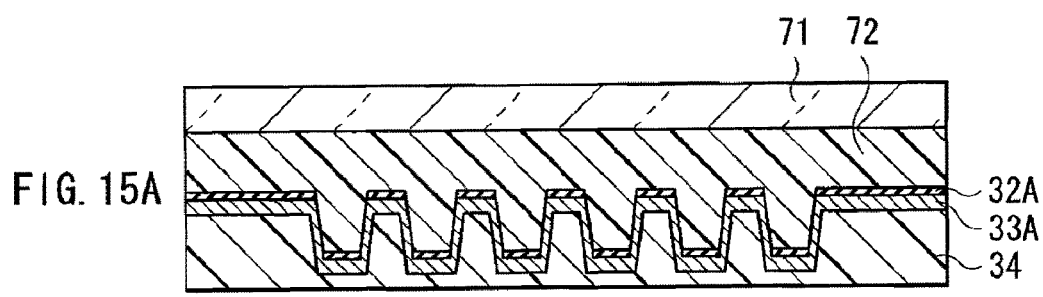
FIGS. 15A and 15B are cross sections illustrating a process subsequent to FIGS. 14A and 14B.
Figure 15B:
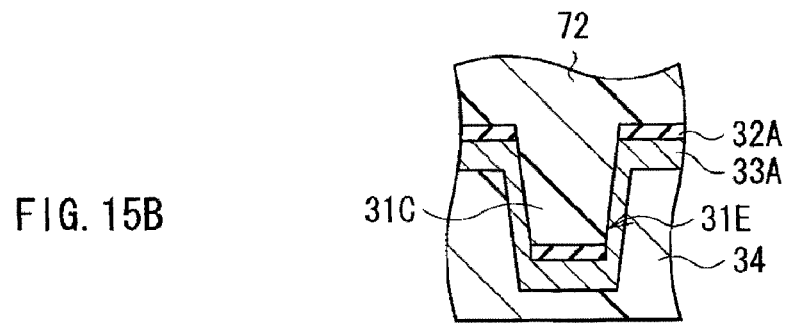

After removal of the light absorption material film 32A on the side face 31E of the reflective element 31C, as illustrated in FIGS. 14A and 14B, a reflecting material film 33A is formed on the surface of the base 31. Subsequently, as illustrated in FIGS. 15A and 15B, for example, by spin coating, the periphery of the reflective element 31C is buried with the burying layer 34 made of the above-described material. After that, by polishing the front end part of the reflective element 31C, the reflecting material film 33A and the light absorption material film 32A on the front end face 31F of the reflective element 31C are removed. As illustrated in FIGS. 16A and 16B, the light absorption film 32 made of the light absorption material film 32A is formed in the planarized region 31D. The reflector film 33 made of the reflecting material film 33A is formed on the side face 31E of the reflective element 31C and the light absorption film 32. By the above operation, the reflector 30 illustrated in FIG. 1 is formed.

Figure 17:
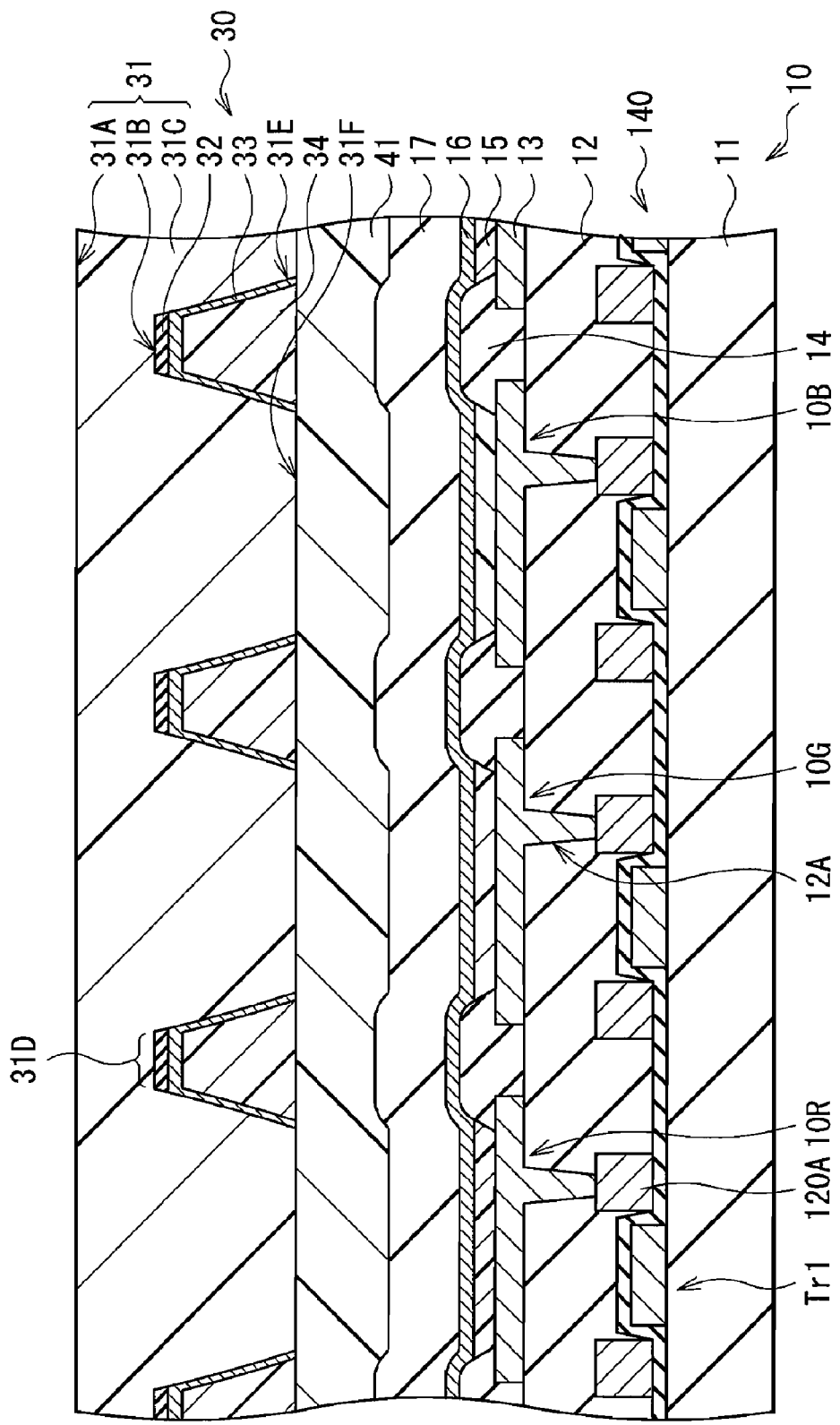
FIG. 17 is a cross section illustrating a process subsequent to FIGS. 16A and 16B.

After formation of the reflector 30 and the light emission panel 10, as illustrated in FIG. 17, the adhesion layer 41 is formed on the protection film 17 of the light emission panel 10. The reflector 30 is disposed on the light extraction side (the second electrode 16 side) of the light emission panel 10 in a state where the front end face 31F of the reflective element 31C faces each of the organic light emitting elements 10R, 10G, and 10B, and is adhered by the adhesion layer 41.

Figure 18A:
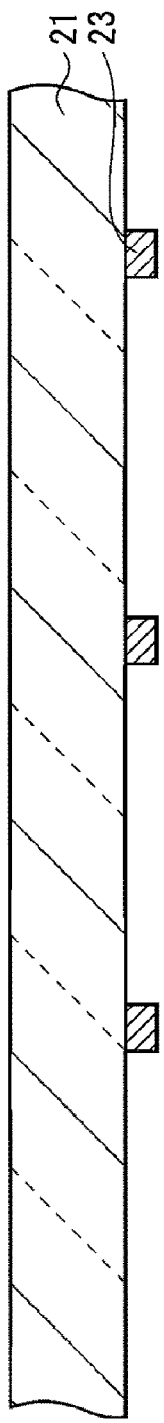
FIGS. 18A to 18C are cross sections illustrating a process subsequent to FIG. 17.
Figure 18B:
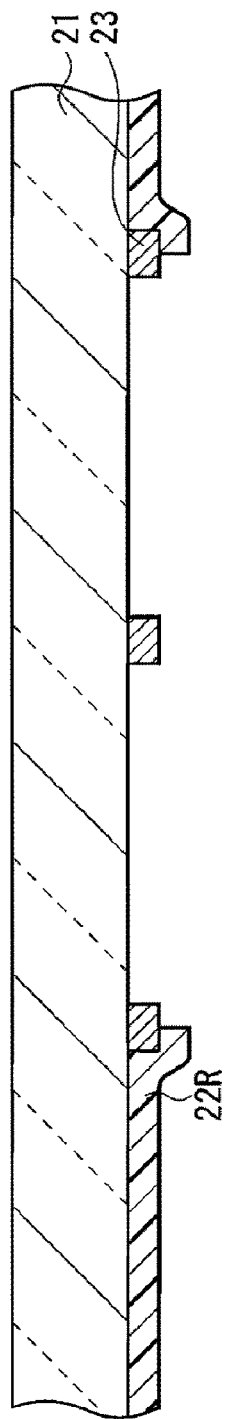
Figure 18C:
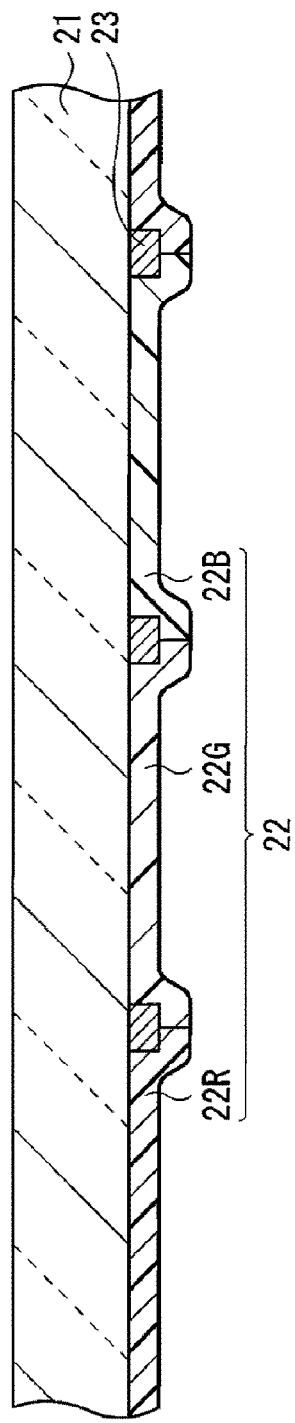

As illustrated in FIG. 18A, the light shield film 23 made of the above-described material is formed on the sealing substrate 21 made of the above-described material and is patterned in a predetermined shape. Subsequently, as illustrated in FIG. 18B, the material of the red filter 22R is coated by spin coating or the like on the sealing substrate 21, patterned by the photolithography technique, and baked, thereby forming the red filter 22R. At the time of patterning, the periphery of the red filter 22R may lie on the light shield layer 23. After that, as illustrated in FIG. 18C, the blue filter 22B and the green filter 22G are sequentially formed in a manner similar to the red filter 22R, thereby forming the sealing panel 20.

Subsequently, the adhesive layer 42 is formed on the reflector 30, and the reflector 30 and the sealing panel 20 are adhered to each other with the adhesion layer 42 therebetween. By the above operations, the display device illustrated in FIGS. 1 to 3 is completed.

The display device may be also manufactured, for example, as follows.

First, in a manner similar to the above-described manufacturing method, the light emission panel 10 is formed by the processes illustrated in FIGS. 4A and 4B to FIG. 7.

Figure 19C:

The reflector 30 is also formed. FIGS. 19A to 19C to FIGS. 24A and 24B illustrate another method of manufacturing the reflector 30. First, as illustrated in FIG. 19A, in a manner similar to the above-described manufacturing method, the resist film 62A is formed on the glass substrate 61 by the process illustrated in FIG. 8A. At that time, as the material of the resist film 62A, a permanent resist represented by "SU-8 (trade name)" manufactured by Nippon Kayaku Co., Ltd. is used. Subsequently, as illustrated in FIG. 19B, in a manner similar to the above-described manufacturing method, the resist film 62A is patterned by the process illustrated in FIG. 8B. As illustrated in FIG. 19C, the reflective element 31C made by the resist film 62A is formed on the glass substrate 61, and the resultant is usable as the base 31.

Figure 20A:
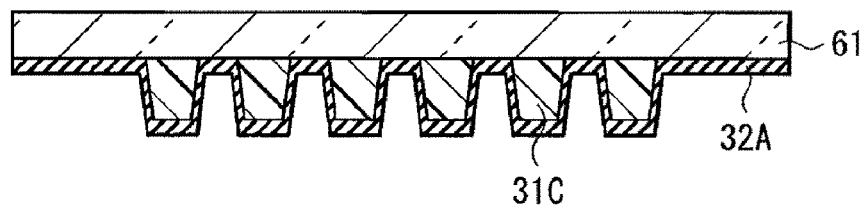
FIGS. 20A and 20B are cross sections illustrating a process subsequent to FIGS. 19A to 19C.
Figure 20B:
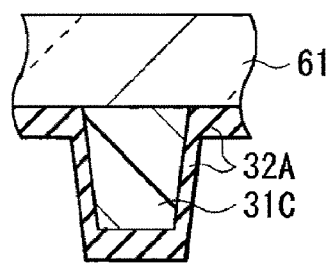

As illustrated in FIGS. 20A and 20B, in a manner similar to the above-described manufacturing method, the light absorption material film 32A is formed on the surface of the base 31 by the processes illustrated in FIGS. 12A and 12B.

Figure 21A:
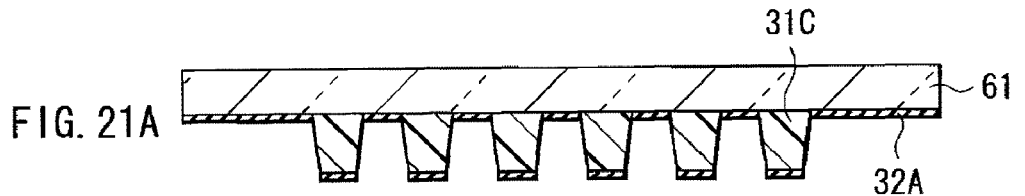
FIGS. 21A and 21B are cross sections illustrating a process subsequent to FIGS. 20A and 20B.
Figure 21B:
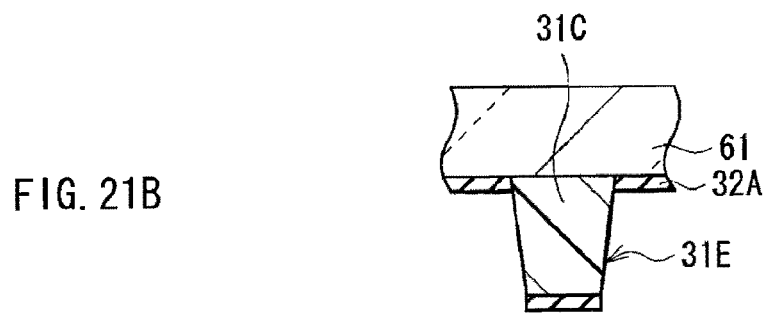

After that, as illustrated in FIGS. 21A and 21B, in a manner similar to the above-described manufacturing method, the light absorption material film 32A on the side face 31E of the reflective element 31C is removed by isotropic etching by the processes illustrated in FIGS. 13A and 13B.

Figure 22A:
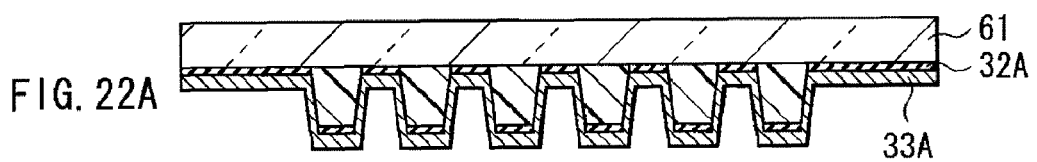
FIGS. 22A and 22B are cross sections illustrating a process subsequent to FIGS. 21A and 21B.
Figure 22B:
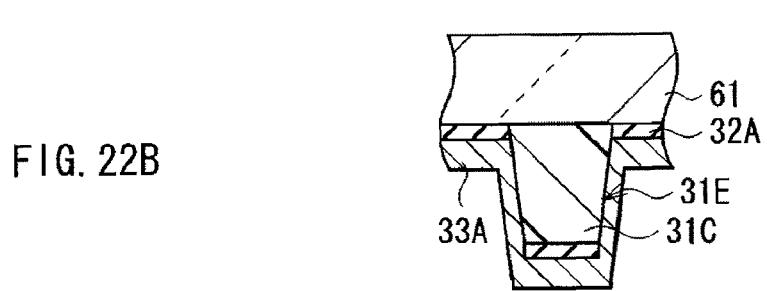

After removal of the light absorption material film 32A on the side face 31E of the reflective element 31C, as illustrated in FIGS. 22A and 22B, the reflecting material film 33A is formed on the second surface 31B of the base 31 by the processes illustrated in FIGS. 14A and 14B in a manner similar to the above-described manufacturing method.

Figure 23A:
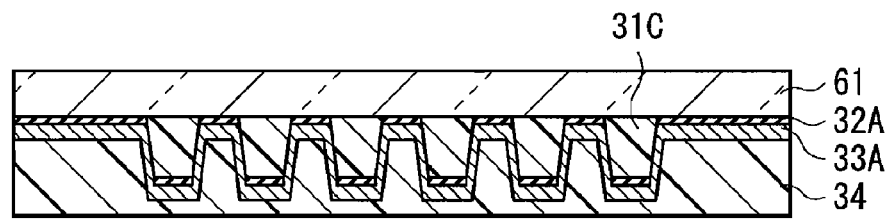
FIGS. 23A and 23B are cross sections illustrating a process subsequent to FIGS. 22A and 22B.
Figure 23B:
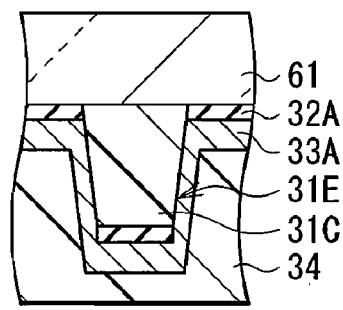
Figure 24A:
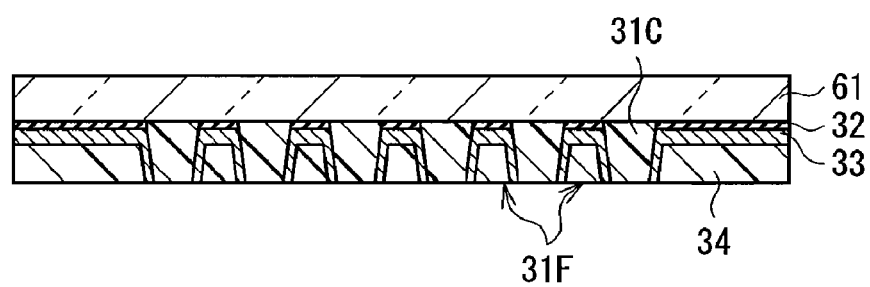
FIGS. 24A and 24B are cross sections illustrating a process subsequent to FIGS. 23A and 23B.
Figure 24B:
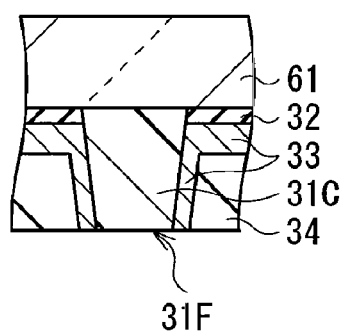

After formation of the reflecting material film 33A, as illustrated in FIGS. 23A and 23B, in a manner similar to the above-described manufacturing method, the periphery of the reflective element 31C is buried by the burying layer 34 by the processes illustrated in FIGS. 15A and 15B. Subsequently, as illustrated in FIGS. 24A and 24B, in a manner similar to the above-described manufacturing method, by polishing the front end part of the reflective element 31C by the processes illustrated in FIGS. 16A and 16B, the light absorption film 32 made by the light absorption material film 32A is formed in the planarized region 31D. On the side face 31E of the reflective element 31C and the light absorption film 32, a reflector film 33 made by a reflecting material film is formed. In such a manner, the reflector 30 illustrated in FIG. 3 is formed.

After formation of the reflector 30 and the light emission panel 10, in a manner similar to the above-described manufacturing method, by the process illustrated in FIG. 17, the reflector 30 is disposed on the light extraction side (the second electrode 16 side) of the light emission panel 10 and is adhered by the adhesion layer 41.

In a manner similar to the above-described manufacturing method, by the processes illustrated in FIGS. 18A to 18C, the sealing panel 20 is formed, and the reflector 30 and the sealing panel 20 are adhered to each other with the adhesion layer 42 therebetween. By the operations, the display device illustrated in FIGS. 1 to 3 is completed.

In the display device, a scan signal is supplied from the scan line drive circuit 130 to each of the pixels via the gate electrode of the write transistor Tr2, and an image signal from the signal line drive circuit 120 is held in the retention capacitor Cs via the write transistor Tr2. That is, the drive transistor Tr1 is on/off-controlled in response to the signal held in the retention capacitor Cs. Under the control, the drive current Id is injected to the organic light emitting elements 10R, 10G, and 10B, recombination of holes and electrons occurs, and light is generated. The light passes through the second electrode 16, the reflector 30, the color filter 22, and the sealing substrate 21 and is extracted.

Concretely, light generated by the organic light emitting elements 10R, 10G, and 10B enters from the front end face 31F of the reflective element 31C, is reflected by the reflector film 33 formed on the side face 31E of the reflective element 31, and is extracted to the outside. Therefore, the light extraction efficiency increases, and luminance improves. Since the light absorption film 32 is formed in the planarized region 31D in the second surface 31B of the base 31, the outside light "h" passed through the light shield film 23 is absorbed by the light absorption film 32. Therefore, retro-reflection of the outside light by the reflector film 33 is suppressed, and stray light is reduced. Thus, reduction in contrast is suppressed.

In the display device of the embodiment as described above, the light absorption film 32 is formed in the planarized region 31D in the second surface 31B of the base 31 of the reflector 30. Consequently, the outside light is absorbed by the light absorption film 32, and contrast reduction caused by retro-reflection of outside light is suppressed.

In the method of manufacturing the display device of the embodiment, in the process of forming the reflector 30, the light absorption material film 32A is formed in the second surface 31B of the base 31. The light absorption material film 32A on the side face 31E of the reflective element 31C is removed by isotropic etching. After that, the reflecting material film 33A is formed in the second surface 31B in the base 31, and the light absorption material film 32A and the reflecting material film 33A at the front end face 31F of the reflecting element 31C are removed. Thus, the display device of the embodiment is manufactured by simple processes.

Second Embodiment

Figure 25:
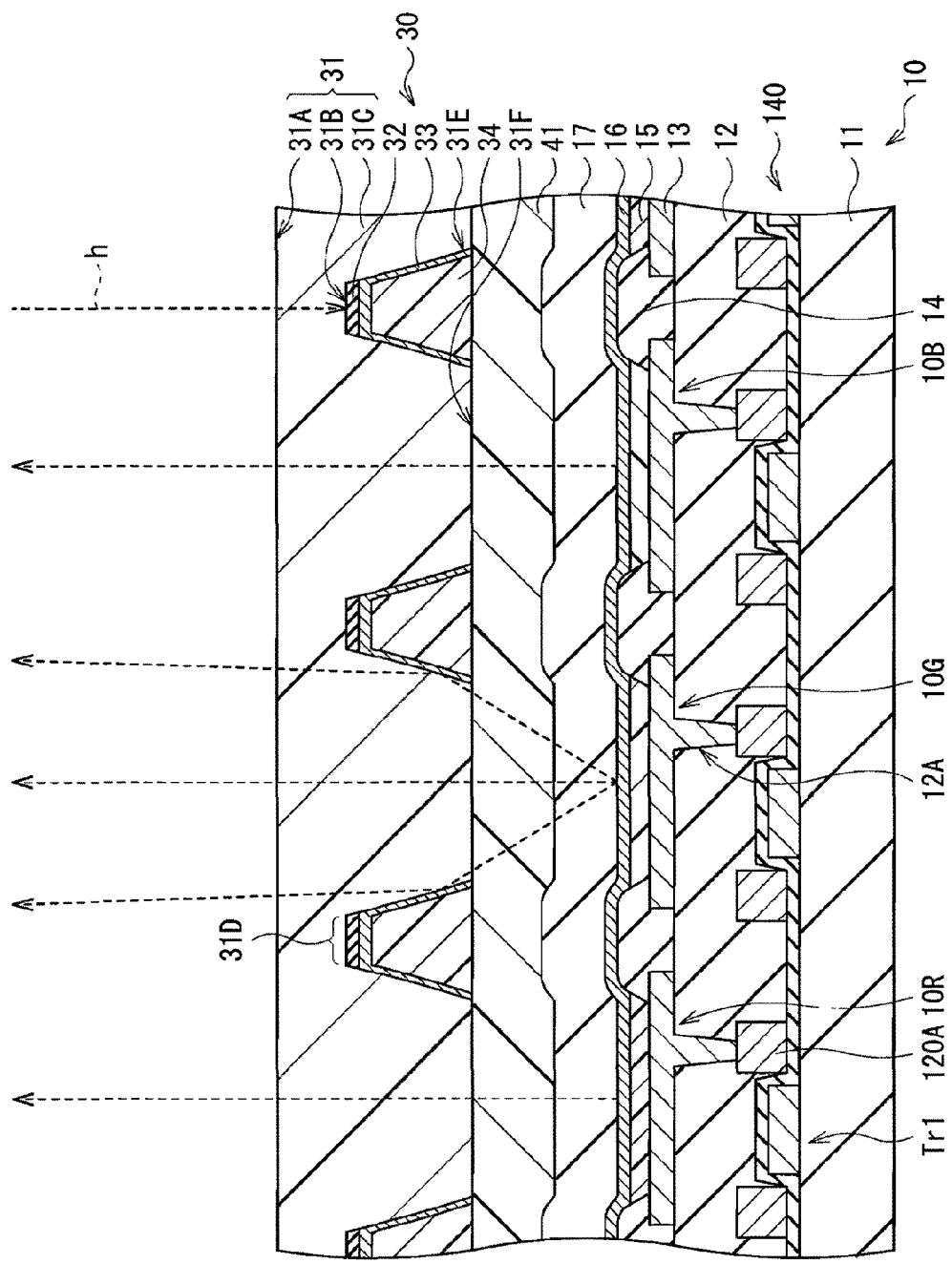
FIG. 25 is a diagram illustrating a configuration of a display device according to a second embodiment of the present invention.

FIG. 25 illustrates a sectional configuration of a display device according to a second embodiment of the present invention. The display device of the embodiment has configuration, action, and effect similar to those of the foregoing first embodiment except for a color-filter-less structure which does not have the sealing panel 20 and the adhesion layer 42, and may be manufactured similarly.

Third Embodiment

Figure 26:
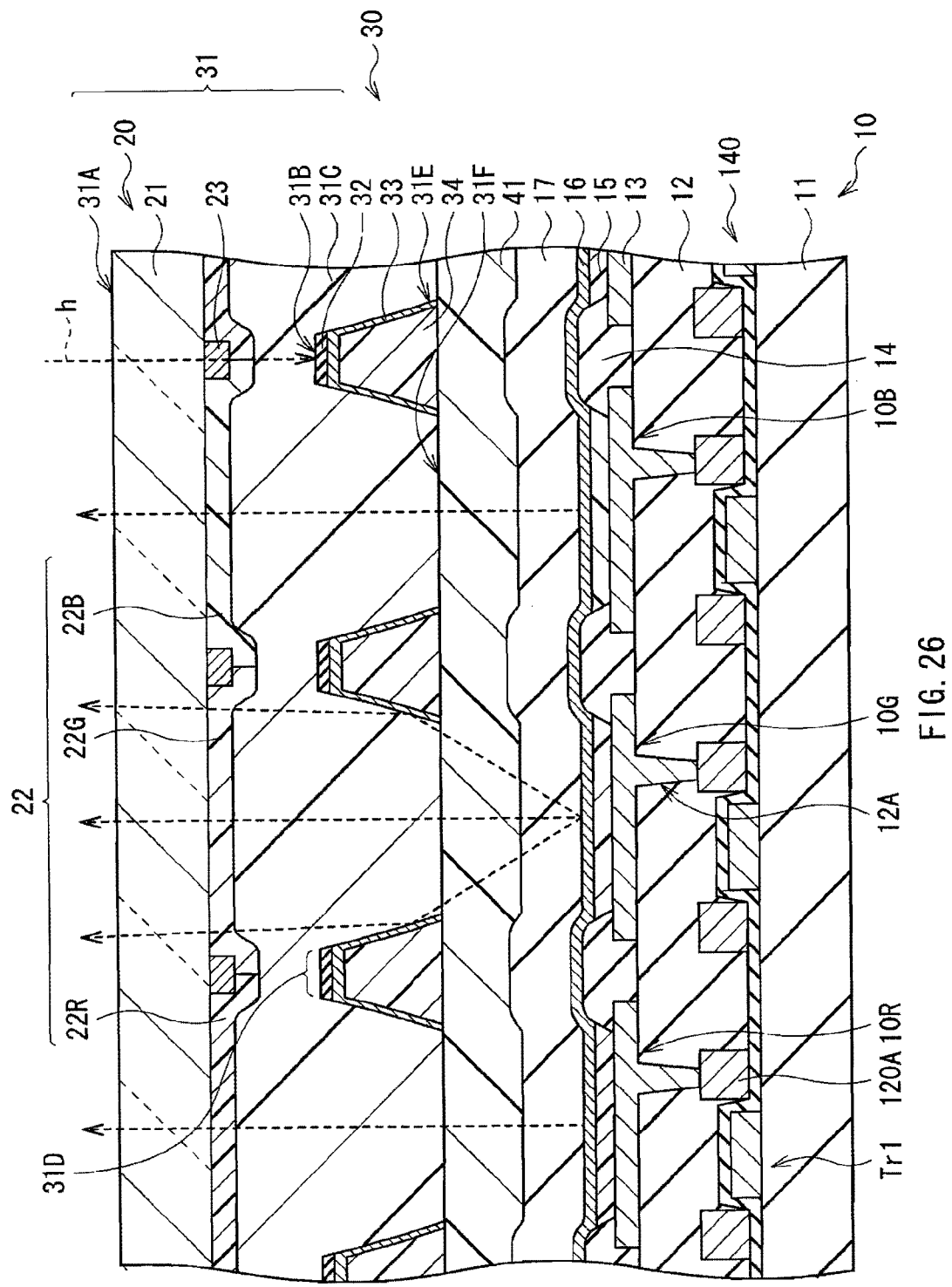
FIG. 26 is a diagram illustrating a configuration of a display device according to a third embodiment of the present invention.

FIG. 26 illustrates a sectional configuration of a display device according to a third embodiment of the present invention. The display device of the embodiment has a configuration similar to that of the first embodiment except that it has a color-filter-integrated reflector in which the sealing panel 20 is integrated with the reflector 30, and the color filter 22 is provided on the bottom face of the reflective element 31C.

The display device may be manufactured, for example, as follows.

First, in a manner similar to the first embodiment, by the processes illustrated in FIGS. 4A and 4B to FIG. 7, the light emission panel 10 is formed. In a manner similar to the first embodiment, by the process illustrated in FIGS. 18A to 18C, the sealing panel 20 is formed.

Next, the reflector 30 is formed by any of the two manufacturing methods described in the first embodiment. By using the sealing panel 20 as the glass substrate 71 in the photo imprint method illustrated in FIGS. 10A and 10B, or the glass substrate 61 illustrated in FIG. 19A, the color filter 22 is formed on the bottom face of the reflective element 31C.

Subsequently, in a manner similar to the first embodiment, the reflector 30 is disposed on the light extraction side (the second electrode 16 side) of the light emission panel 10 and is adhered by the adhesion layer 41. By the above operation, the display device illustrated in FIG. 26 is completed.

Since the color filter 22 is formed on the bottom face of the reflective element 31C, the sealing panel 20 and the reflector 30 are integrated, the number of parts may be reduced as compared with that in the first embodiment, and the adhering process may be also reduced. In addition, it is unnecessary to detach the color filter 22 in order to decrease cost, and there is no fear that performance deterioration such as contrast reduction or deterioration in visibility is caused. By providing the reflector 30, luminance is raised without increasing current injection, and the reliability of device life and the like are improved.

In the embodiment, in addition to the action and effect of the first embodiment, the number of parts is allowed to be reduced, and the number of alignment times for adhesion is allowed to be decreased. Therefore, it is advantageous from the viewpoints of manufacturing cost, takt time, yield, and the like.

Fourth Embodiment

Figure 27:
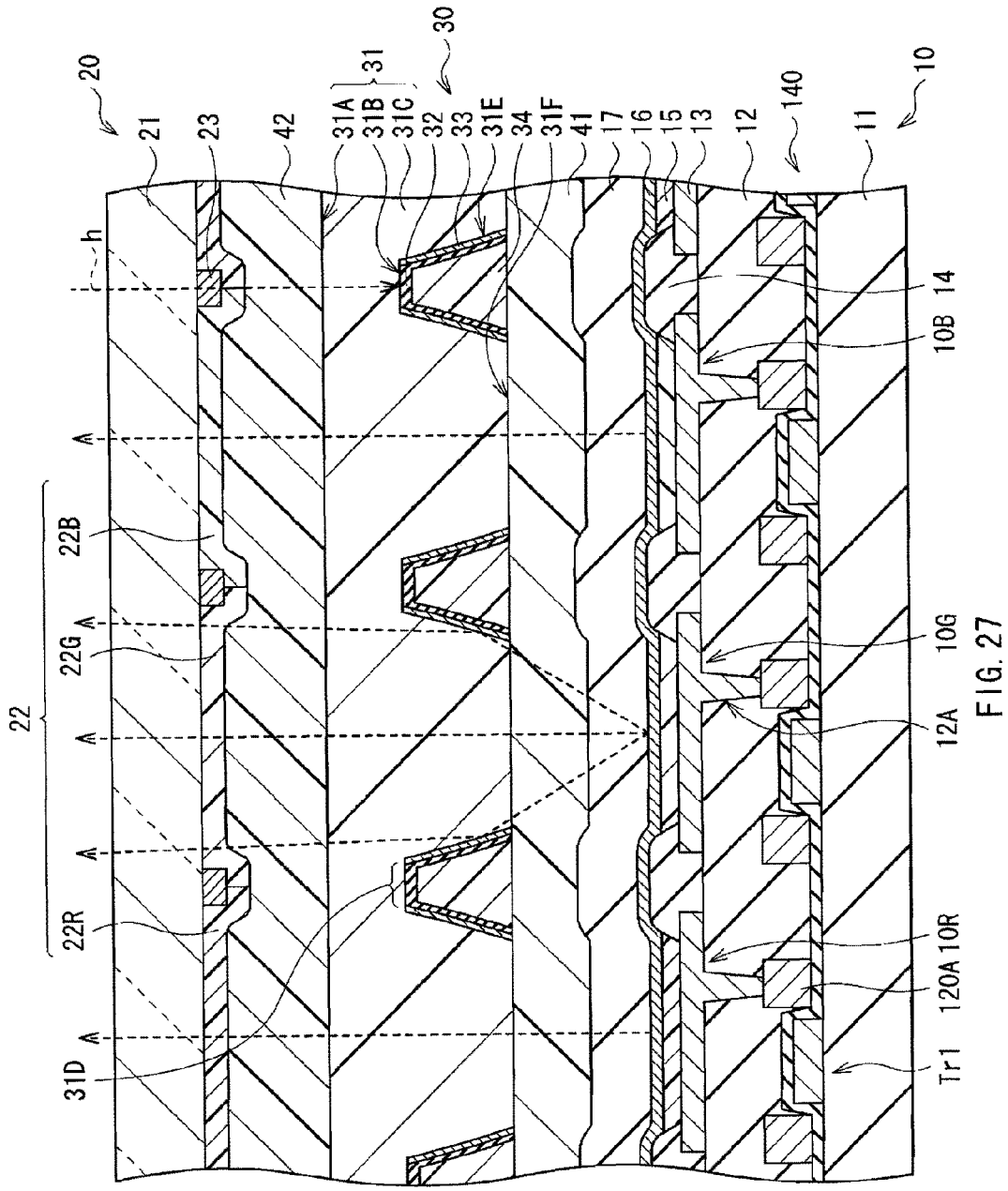
FIG. 27 is a diagram illustrating a configuration of a display device according to a fourth embodiment of the present invention.

FIG. 27 shows a sectional configuration of a display device according to a fourth embodiment. In the display device, the light absorption film 32 is formed on the planarized region 31D and the reflector film 33 on the side face 31E of the reflective element 31C. The light absorption film 32 formed on the reflector film 33 absorbs a light component which does not enter the front end face 31F in the reflective element 31C, in light generated by the organic light emitting elements 10R, 10G, and 10B. With the configuration, the light component which did not enter the reflective element 31C is reflected by the reflector film 33 of the side face 31E of the adjacent reflective element 31C and becomes stray light, and it suppresses that the stray light causes mixture of a color to an adjacent pixel. Except for this, the display device of the embodiment has a configuration similar to that of the foregoing first embodiment.

The display device may be manufactured, for example, as follows.

FIGS. 28A to 28C to FIG. 35 illustrate the method of manufacturing the display device in process order. The manufacturing process similar to that of the first embodiment will be described with reference to FIGS. 4A and 4B to FIG. 7 and FIGS. 18A to 18C.

First, in a manner similar to the first embodiment, the light emission panel 10 is formed by the processes illustrated in FIGS. 4A and 4B to FIG. 7.

Figure 28A:
FIGS. 28A to 28C are cross sections illustrating a method of manufacturing the display device illustrated in FIG. 27 in process order.

The reflector 30 is also formed. First, as illustrated in FIG. 28A, in a manner similar to the first embodiment, the resist film 62A is formed on the glass substrate 61 by the process illustrated in FIG. 8A.

Figure 28B:
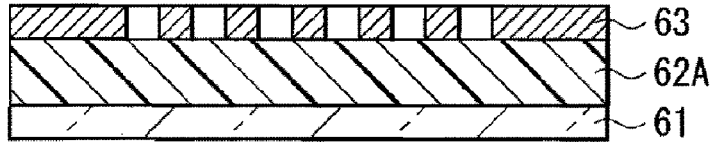
Figure 28C:

As illustrated in FIG. 28B, in a manner similar to the first embodiment, the resist film 62A is patterned by the process illustrated in FIG. 8B. By the process, the mother die 64 in which the reflective elements 62 are formed is formed on the glass substrate 61 as illustrated in FIG. 28C.

Figure 29A:
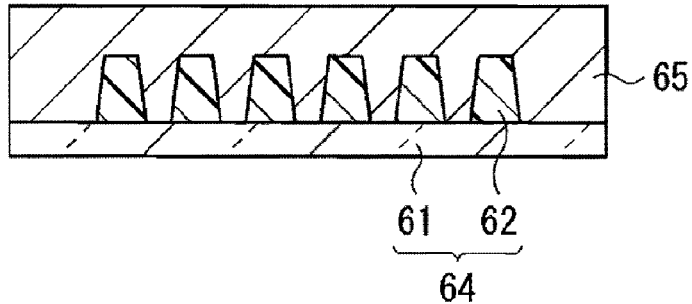
FIGS. 29A and 29B are cross sections illustrating a process subsequent to FIGS. 28A to 28C.
Figure 29B:
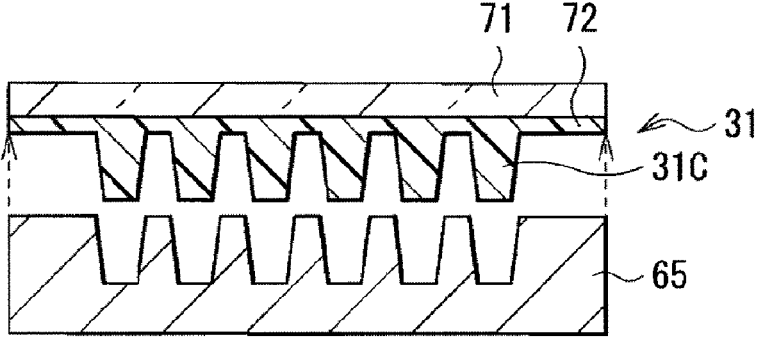

As illustrated in FIG. 29A, in a manner similar to the first embodiment, by the process illustrated in FIG. 9A, the mold 65 is formed by electrocasting using the mother die 64. After that, as illustrated in FIG. 29B, in a manner similar to the first embodiment, by the processes illustrated in FIG. 9B to FIG. 11, by photo imprint or thermal imprint using the mold 65, the base 31 is formed. The base may be formed by the processes described with reference to FIGS. 19A to 19C in the first embodiment.

Figure 30A:
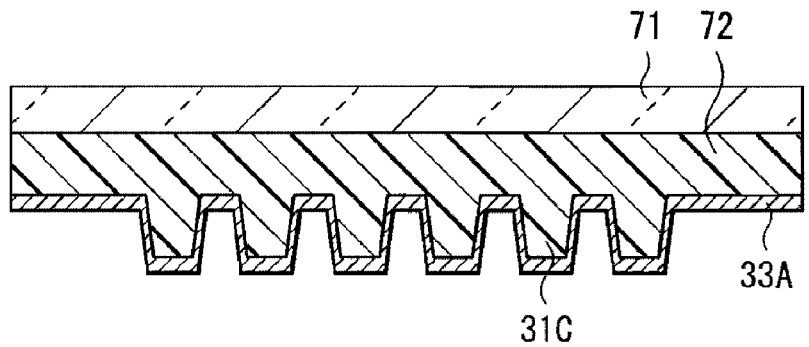
FIGS. 30A and 30B are cross sections illustrating a process subsequent to FIGS. 29A and 29B.
Figure 30B:
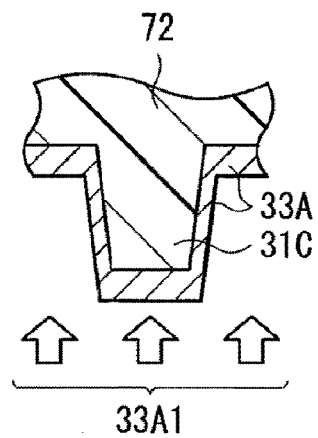

After formation of the base 31, as illustrated in FIG. 30A, the reflector film 33A made of aluminum (Al) or an alloy containing aluminum (Al) is formed on the second surface 31B of the base 31. At this time, as illustrated in FIG. 30B, a film forming material 33A1 is deposited in a direction almost perpendicular to the second surface 31B of the base 31. Consequently, the film forming rate in the side face 31E of the reflective element 31C and that in the planarized region 31D in the second surface 31B of the base 31 and the front end face 31F of the reflective element 31C are different from each other. The film forming rate in the side face 31E of the reflective element 31C is low.

Figure 31A:
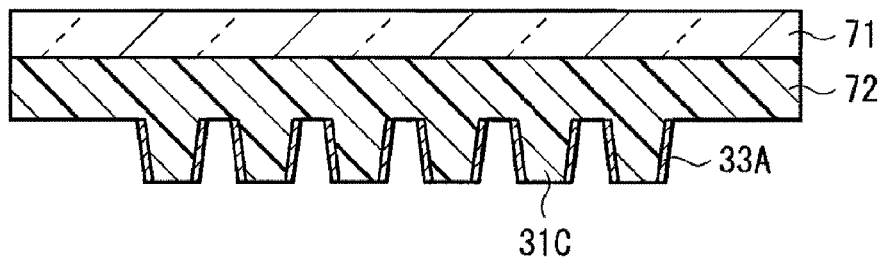
FIGS. 31A and 31B are cross sections illustrating a process subsequent to FIGS. 30A and 30B.
Figure 31B:
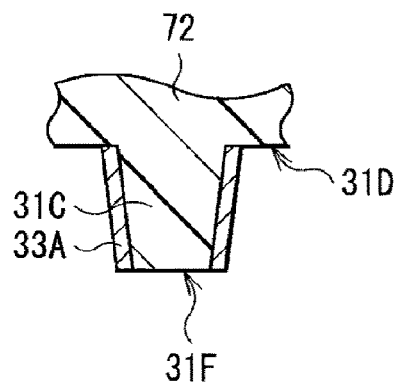

After forming the reflecting material film 33A, as illustrated in FIGS. 31A and 31B, the reflecting material film 33A on the planarized region 31D and the front end face 31F of the reflective element 31C is removed by anisotropic etching. Concretely, the bias of the base 31 is adjusted by a method of, for example, RIE (Reactive Ion Etching), and the entire surface is etched under a condition so that the etching rate in the planarized region 31D and the front end face 31F of the reflective element 31C and that in the side face 31E of the reflective element 31C are different from each other. Etching species contain, for example, Cl, F, or Br ions. Concretely, for example, a Cl2-based etching gas may be used. Ion species having high linear reactivity (short time constant) reach the base 31, the reflecting material film 33A on the planarized region 31D and the front end face 31F of the reflective element 31C is etched off first, and the reflecting material film 33B remains only on the side faces 31E of the reflecting element 31C.

Figure 32A:
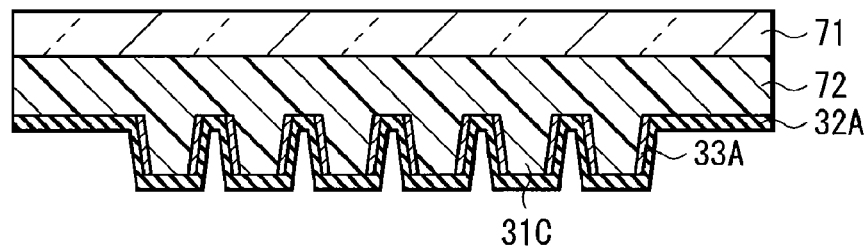
FIGS. 32A and 32B are cross sections illustrating a process subsequent to FIGS. 31A and 31B.
Figure 32B:
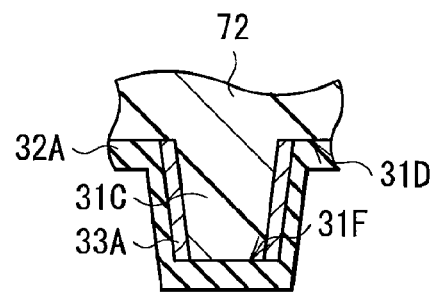
Figure 33A:
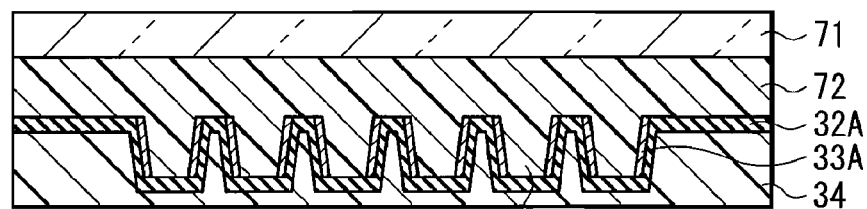
FIGS. 33A and 33B are cross sections illustrating a process subsequent to FIGS. 32A and 32B.
Figure 33B:
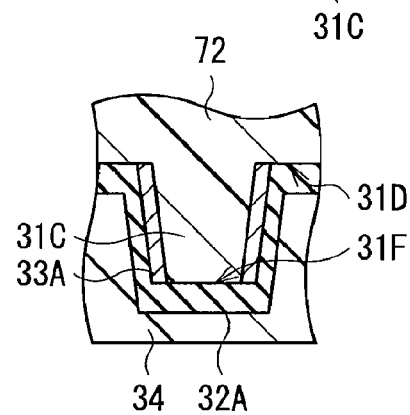
Figure 34A:
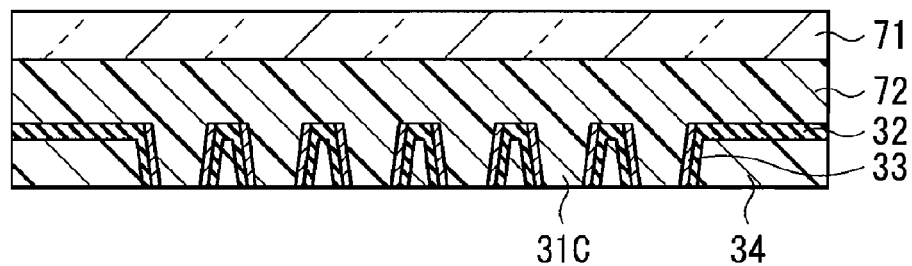
FIGS. 34A and 34B are cross sections illustrating a process subsequent to FIGS. 33A and 33B.
Figure 34B:
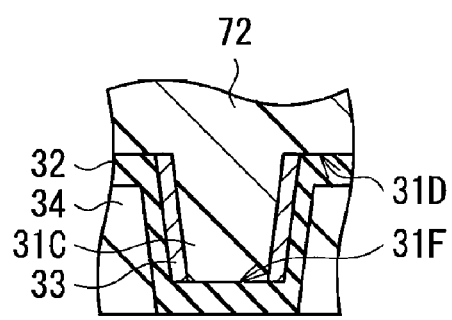

After removal of the reflecting material film 33A on the planarized region 31D and the front end face 31F of the reflecting element 31C, as illustrated in FIGS. 32A and 32B, the light absorption material film 32A is formed on the surface of the base 31. The film forming method is not limited to a method such as evaporation or sputtering but may be any method which is capable of realizing both properly high productivity and properly low manufacturing cost such as spin coating, spraying, slit coating, dip coating, squeegee printing, or the like. Subsequently, as illustrated in FIGS. 33A and 33B, the periphery of the reflective element 31C is buried with the burying layer 34. After that, as illustrated in FIGS. 34A and 34B, by polishing the front end part of the reflective element 31C, the reflector film 33 made by the reflecting material film 33A is formed on the side face 31E of the reflective element 31C. The light absorption film 32 made by the light absorption material film 32A is formed on the planarized region 31D and the reflector film 33. As a result, the reflector 30 illustrated in FIG. 27 is formed.

Figure 35:
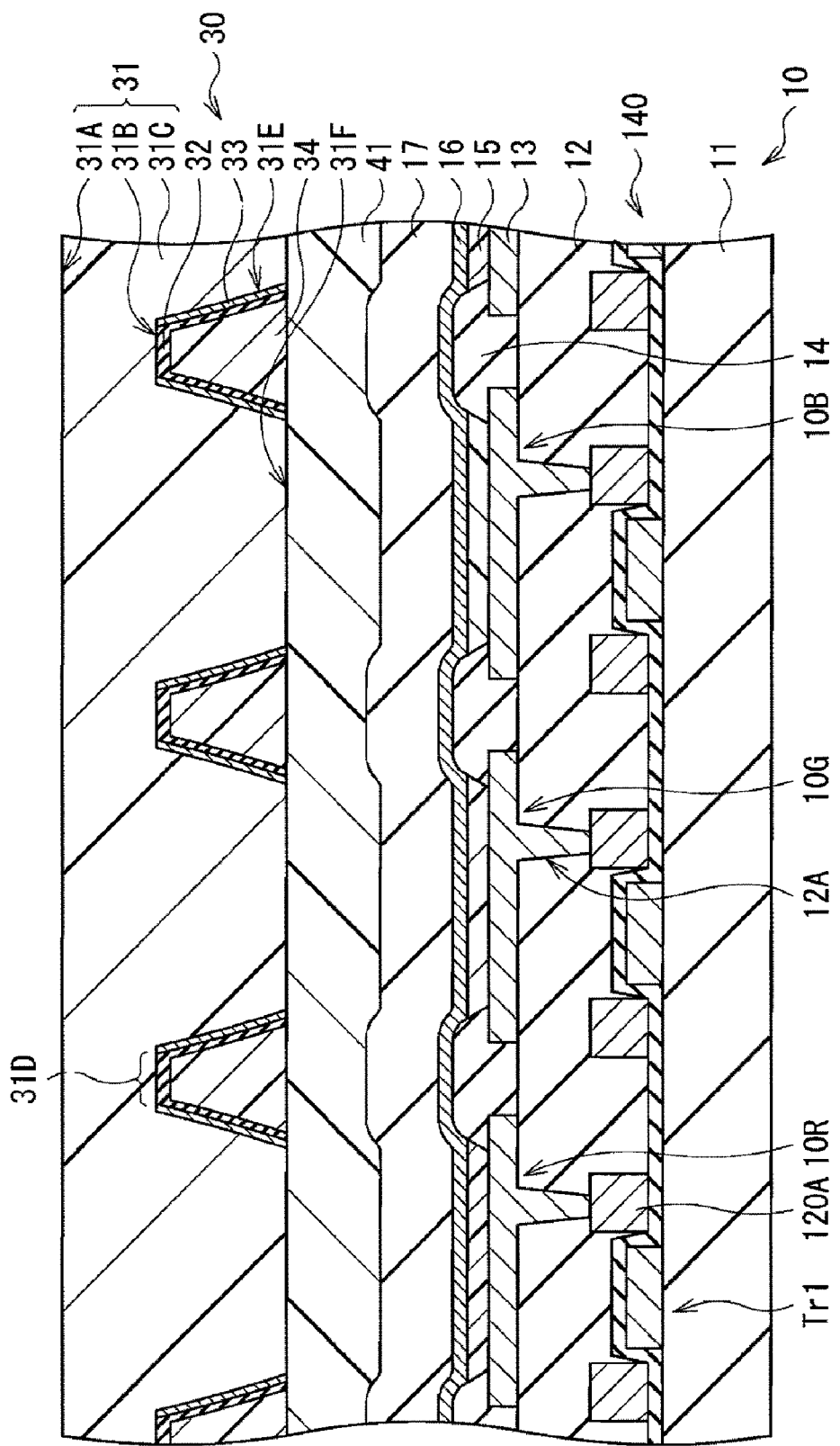
FIG. 35 is a cross section illustrating a process subsequent to FIGS. 34A and 34B.

After formation of the reflector 30 and the light emission panel 10, as illustrated in FIG. 35, in a manner similar to the first embodiment, the reflector 30 is disposed on the light extraction side (the second electrode 16 side) of the light emission panel 10, and is adhered by the adhesion layer 41.

In a manner similar to the first embodiment, by the processes illustrated in FIGS. 18A to 18C, the sealing panel 20 is formed. The reflector 30 and the sealing panel 20 are adhered to each other with the adhesive layer 42 therebetween. By the above processes, the display device illustrated in FIG. 27 is completed.

In the display device, in a manner similar to the first embodiment, light is generated by the organic light emitting elements 10R, 10G, and 10B, and the light enters from the front end face 31F of the reflective element 31C, is reflected by the reflector film 33 formed on the side face 31E of the reflective element 31C, and is extracted to the outside. Therefore, the light extraction efficiency increases, and luminance improves. Since the light absorption film 32 is formed in the planarized region 31D in the second surface 31B of the base 31, the outside light passed through the light shield film 23 is absorbed by the light absorption film 32. Therefore, retro-reflection of the outside light by the reflector film 33 is suppressed, stray light is reduced, and reduction in contrast is suppressed. The light absorption film 32 is formed also on the reflector film 33 on the side face 31E of the reflective element 31C, the light component which does not enter the front end face 31F of the reflective element 31C, in the light generated by the organic light emitting elements 10R, 10G, and 10B is absorbed by the light absorption film 32. The configuration suppresses that the light component which did not enter the reflective element 31C is reflected by the reflector film 33 and causes mixture of a color to an adjacent pixel.

In the display device of the embodiment, the light absorption film 32 is formed on the planarized region 31D in the second surface 31B of the base 31 of the reflector 30. Consequently, the outside light is absorbed by the light absorption film 32, and contrast reduction caused by retro-reflection of outside light is suppressed.

Since the light absorption film 32 is formed on the reflector film 33 on the side face 31E of the reflective element 31C, the light component which did not enter the front end face 31F of the reflective element 31C, in the light generated by the organic light emitting elements 10R, 10G, and 10B is absorbed and the configuration suppresses that the light component causes mixture of a color to an adjacent pixel. In particular, by applying the embodiment to the color-filter-less structure as illustrated in FIGS. 13A and 13B of the second embodiment, deterioration in contrast and picture quality may be suppressed also in the color-filter-less structure, and visibility is allowed to be improved.

In the method of manufacturing the display device of the embodiment, in the process of forming the reflector 30, the reflecting material film 33A is formed on the second surface 31B of the base 31. The reflecting material film 33A on the planarized region 31D and the front end face 31F of the reflective element 31C is removed by isotropic etching. After that, the light absorbing material film 32A is formed on the surface of the base 31, and the light absorption material film 32A and the reflecting material film 33A on the front end face 31F of the reflective element 31C are removed. Thus, the display device of the embodiment can be manufactured by simple processes.

Also in the embodiment, like in the third embodiment, by using the sealing panel 20 as the glass substrate 71 in the photo imprint method illustrated in FIGS. 10A and 10B, or the glass substrate 61 illustrated in FIG. 19A, the color filter 22 may be formed on the bottom face of the reflective element 31C.

MODULES AND APPLICATION EXAMPLES

Hereinbelow, application examples of the display devices explained in the foregoing embodiments will be described. The display devices of the foregoing embodiments is applicable as display devices of electronic devices in all of fields for displaying a video signal entered from the outside or generated internally as an image or a video image, such as a television apparatus, a digital camera, a notebook-sized personal computer, a portable terminal device such as a cellular phone, and a video camera.

Modules

Figure 36:
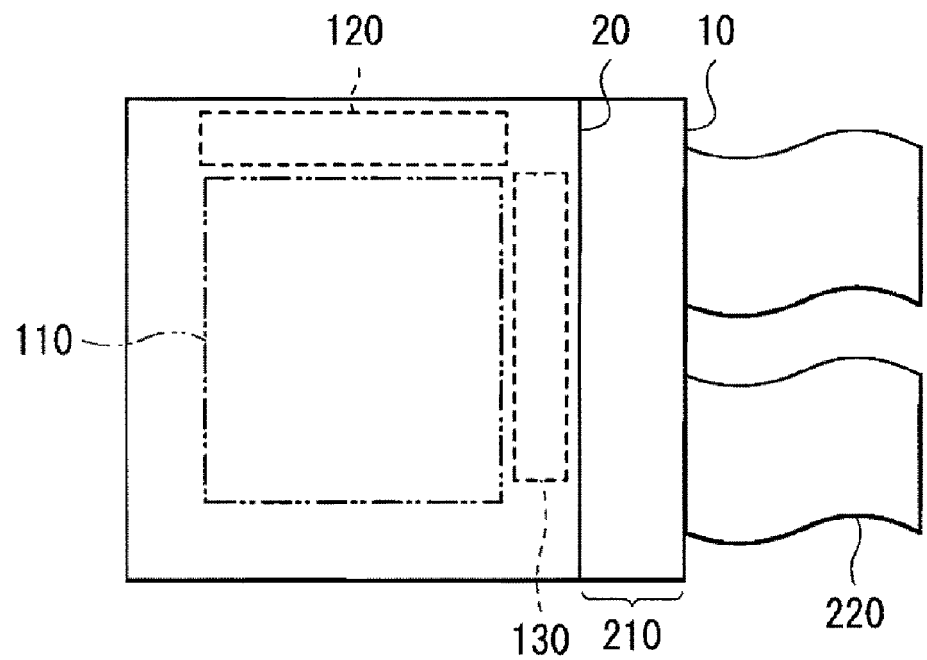
FIG. 36 is a plan view illustrating a schematic configuration of a module including the display device of the foregoing embodiment.

The display device of any of the embodiments is assembled, for example, as a module illustrated in FIG. 36, in various electronic devices in application examples 1 to 5 and the like which will be described later. The module has, for example, at one side of the substrate 11, a region 210 exposed from the sealing panel 20 and the adhesive layer. To the exposed region 210, wirings of the signal line drive circuit 120 and the scan line drive circuit 130 are extended and external connection terminals (not illustrated) are formed. The external connection terminal may be provided with a flexible printed circuit (FPC) 220 for inputting/outputting signals.

Application Example 1

Figure 37:
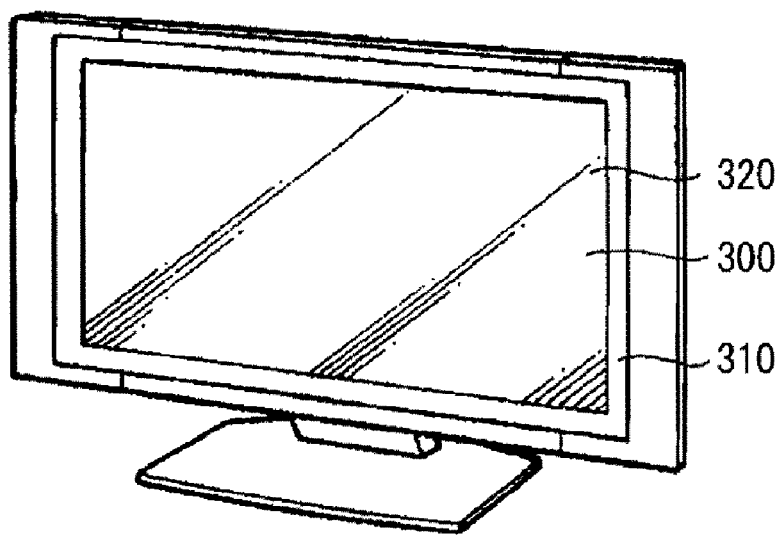
FIG. 37 is a perspective view illustrating the appearance of application example 1 of the display device of the foregoing embodiment.

FIG. 37 illustrates the appearance of a television apparatus to which the display device of the foregoing embodiment is applied. The television apparatus has, for example, a video image display screen 300 including a front panel 310 and a filter glass 320. The video image display screen 300 is constructed by the display device according to any of the embodiments.

Application Example 2

Figure 38A:
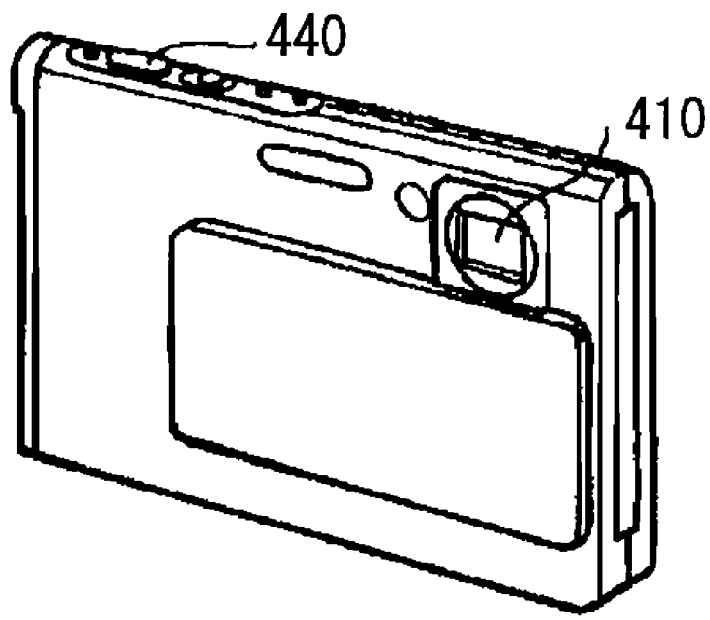
FIG. 38A is a perspective view illustrating the appearance viewed from the surface side of application example 2.
Figure 38B:
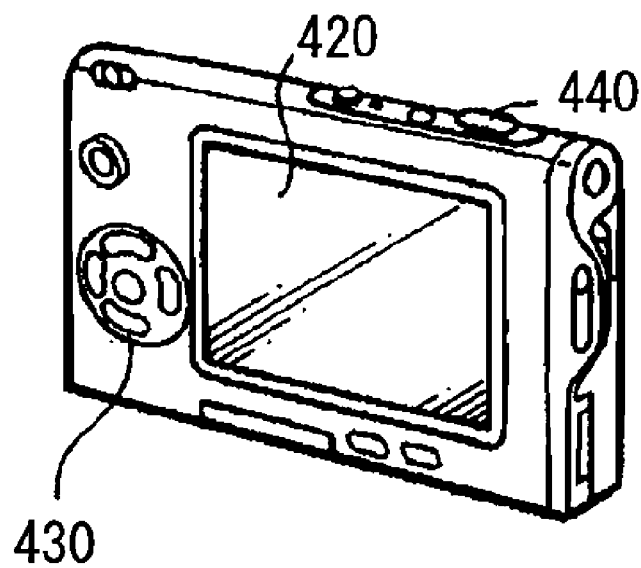
FIG. 38B is a perspective view illustrating the appearance viewed from the back side.

FIGS. 38A and 38B illustrate the appearance of a digital camera to which the display devices of the embodiments are applied. The digital camera has, for example, a light emission unit 410 for flash, a display unit 420, a menu switch 430, and a shutter button 440. The display unit 420 is constructed by the display device according to any of the foregoing embodiments.

Application Example 3

Figure 39:
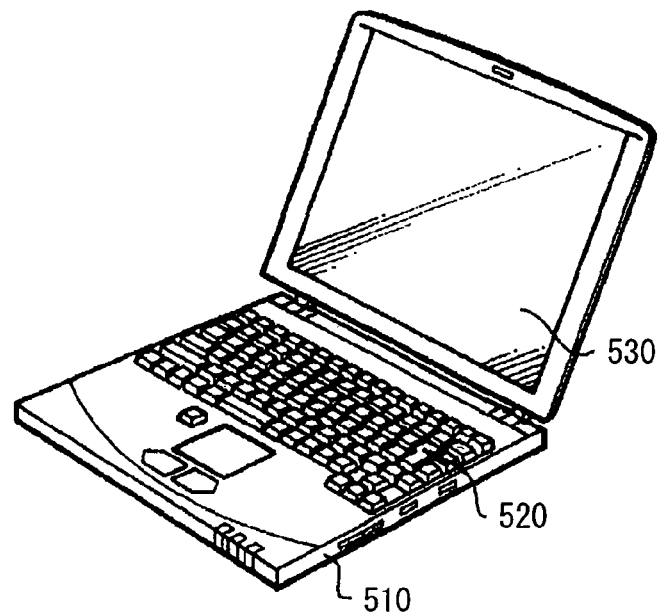
FIG. 39 is a perspective view illustrating the appearance of application example 3.

FIG. 39 illustrates the appearance of a notebook-sized personal computer to which the display device of any of the foregoing embodiments is applied. The notebook-sized personal computer has, for example, a body 510, a keyboard 520 for operation of entering characters and the like, and a display unit 530 for displaying an image. The display unit 530 is constructed by the display device according to any of the foregoing embodiments.

Application Example 4

Figure 40:
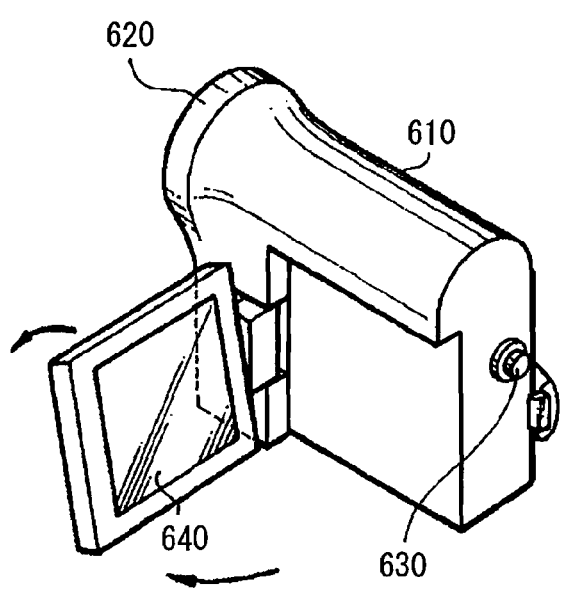
FIG. 40 is a perspective view illustrating the appearance of application example 4.
Figure 41:
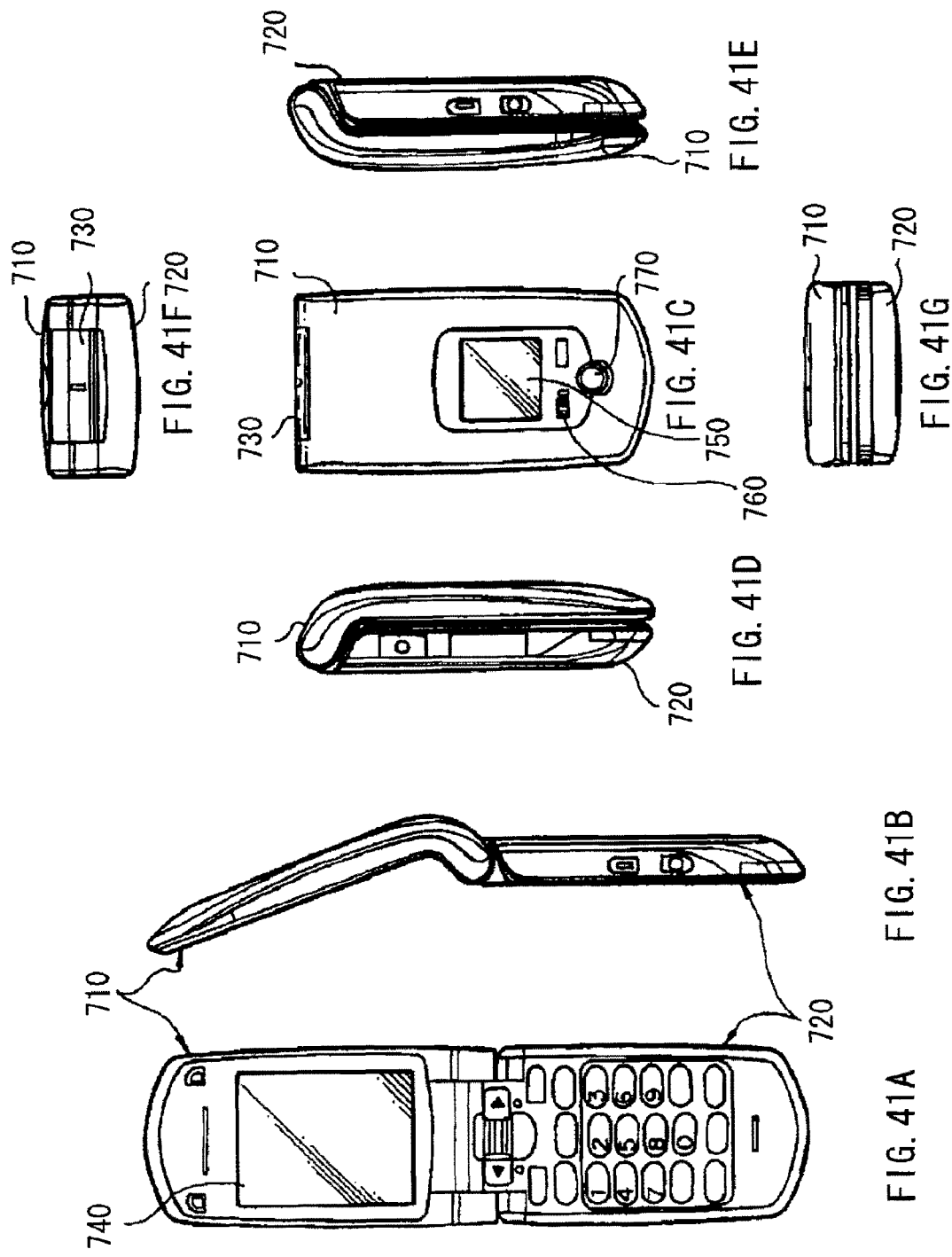
FIG. 41A is a front view illustrating a state where a display device of application example 5 is open.
FIG. 41B is a side view of the display device.
FIG. 41C is a front view illustrating a state where the display device is closed.
FIG. 41D is a left side view.
FIG. 41E is a right side view.
FIG. 41F is a top view.
FIG. 41G is a bottom view.

FIG. 40 illustrates the appearance of a video camera to which the display device of any of the embodiments is applied. The video camera has, for example, a body 610, a lens 620 for shooting a subject, provided on the front face of the body 610, a shooting start-stop switch 630, and a display unit 640. The display unit 640 is constructed by the display device according to any of the embodiments.

Application Example 5

FIGS. 41A to 41G illustrate the appearance of a cellular phone to which the display device of any of the embodiments is applied. The cellular phone is obtained by, for example, coupling an upper-side casing 710 and a lower-side casing 720 via a coupling unit (hinge) 730 and has a display 740, a sub-display 750, a picture light 760, and a camera 770. The display 740 or the sub-display 750 is constructed by the display device according to any of the embodiments.

The present application has been described above by the embodiments. However, the application is not limited to the embodiments but may be variously modified. For example, the present application is not limited to the materials and thicknesses of the layers, the film forming methods, film forming conditions, and the like described in the embodiments, but other materials and thicknesses, other film forming methods, and other film forming conditions may be used. For example, the method of coating the burying layer 34 is not limited to the spin coating but may be any method as long as it satisfies both properly high productivity and properly low manufacturing cost such as spraying, slit coating, dip coating, squeegee printing or the like.

Figure 42:
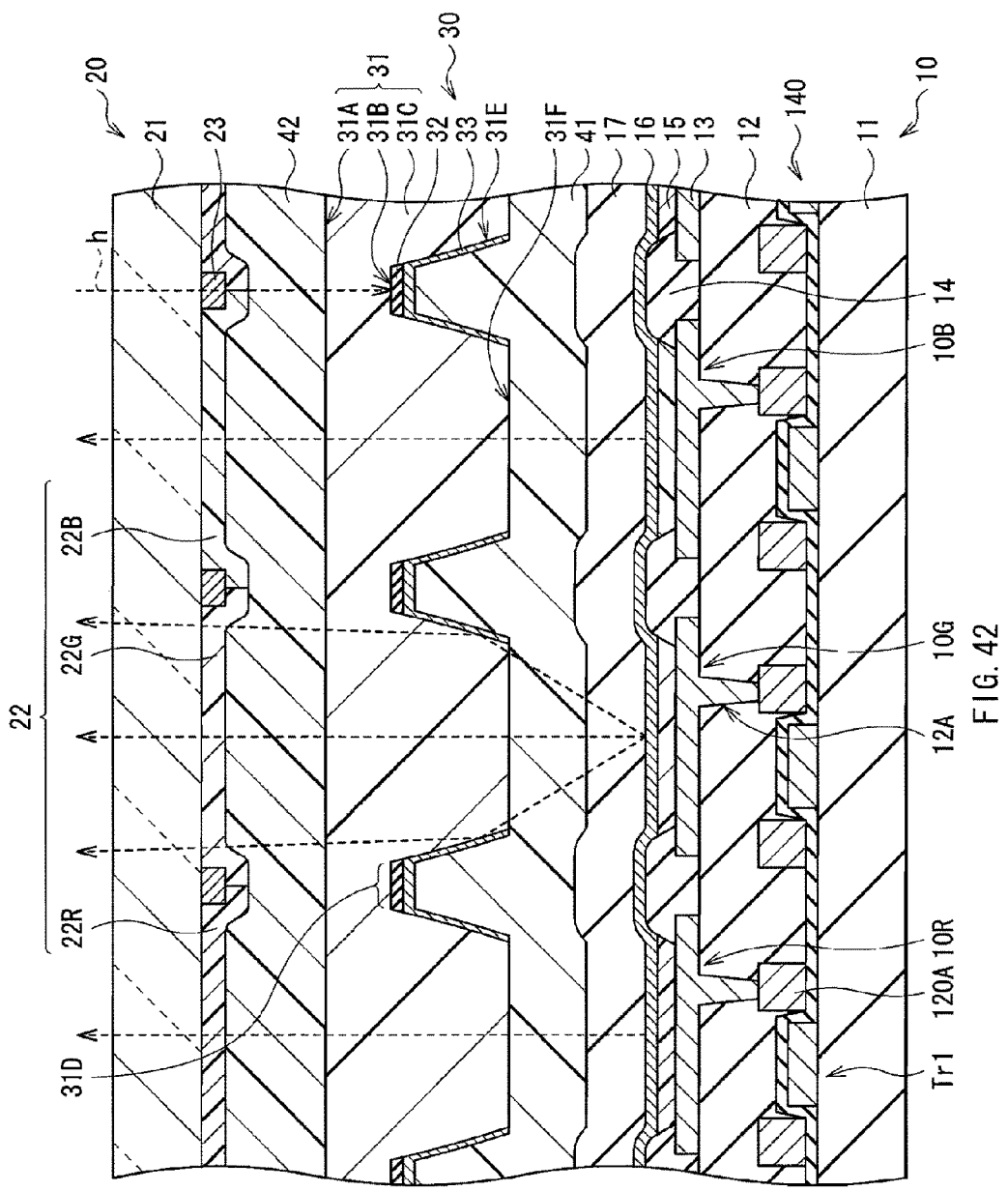
FIG. 42 is a cross section illustrating a modification of the display device illustrated in FIG. 3.

Further, in the foregoing embodiments, the configuration of the organic light emitting elements 10R, 10B, and 10G and the reflector 30 has been concretely described. All of the layers do not have to be provided, and another layer may be also provided. For example, the burying layer 34 of the reflector 30 does not have to be always provided and may not be provided as illustrated in FIG. 42.

Figure 43:
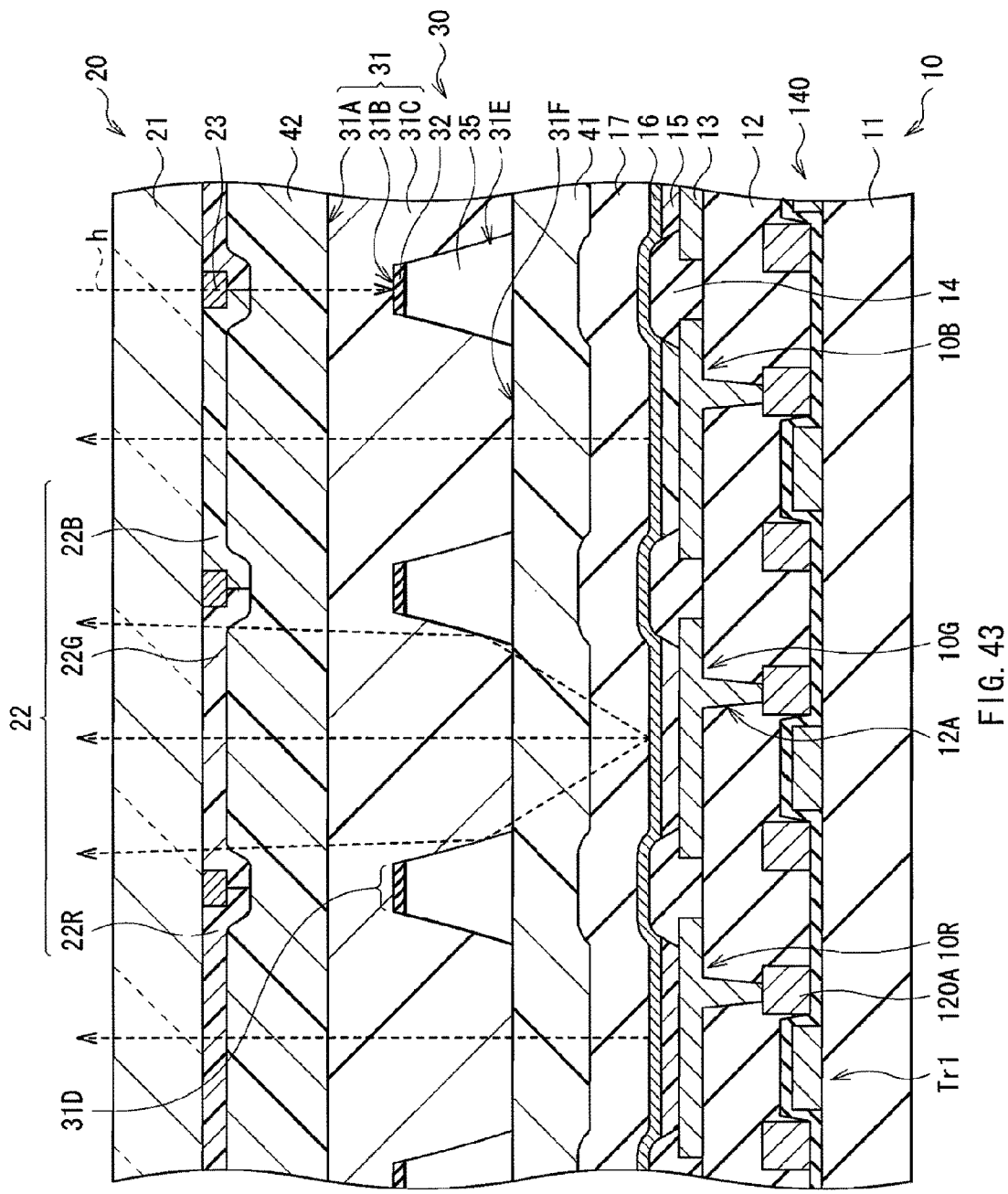
FIG. 43 is a cross section illustrating another modification of the display device illustrated in FIG. 3.

The present application is also applicable to the case where, as illustrated in FIG. 43, the reflector film 33 is not provided and light is totally reflected by the interface between the side face 31E of the reflective element 31C and an air layer 35 in the periphery. In this case, the display device may be manufactured in a manner similar to any of the foregoing embodiments except that the reflecting material film 33A and the burying layer 34 are not formed.

Further, the present application is also applicable to a self-luminous light emitting device using, except for the organic light emitting element, another display element such as an LED (Light Emitting Diode), an FED (Field Emission Display), an inorganic electroluminescence element, or the like.

In addition, the display device of the present invention is applicable to a light emitting device for a purpose other than display, such as an illuminating device.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The invention claimed is:

1. A display device comprising:
 a light emission panel having a plurality of self-luminous light emitting elements on a substrate; and
 a reflector provided on a light extraction side of the light emission panel,
 wherein the reflector includes
 a base having first and second opposed surfaces, the second surface being provided with a reflective element, and
 a light absorbing film formed in a region other than the reflective element in the second surface,
 wherein a reflector film for reflecting light entering from a front end face of the reflective element is formed at least on a side face of the reflective element,
 wherein the light absorbing film is formed on a region other than the reflective element in the second surface and on the reflector film.

2. The display device according to claim1, wherein the reflector film is formed on side faces of the reflective element and on the light absorbing film.

3. The display device according to claim 1, wherein a color filter is provided on a bottom of the reflective element.

* * * * *